United States Patent
Collonge et al.

(10) Patent No.: US 7,812,410 B2
(45) Date of Patent: Oct. 12, 2010

(54) SUSPENDED-GATE MOS TRANSISTOR WITH NON-VOLATILE OPERATION

(75) Inventors: Michael Collonge, Romans (FR); Maud Vinet, Rives (FR); Olivier Thomas, Revel (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/168,417

(22) Filed: Jul. 7, 2008

(65) Prior Publication Data
US 2009/0014769 A1    Jan. 15, 2009

(30) Foreign Application Priority Data
Jul. 9, 2007    (FR) .................... 07 56347

(51) Int. Cl.
H01L 27/20    (2006.01)
H01L 41/04    (2006.01)
H01L 41/083   (2006.01)
(52) U.S. Cl. .............. 257/410; 257/417; 257/418; 257/419; 257/420; 257/424; 257/E27.006
(58) Field of Classification Search ............. 257/410, 257/417, 418, 419, 420, 424, E27.006
See application file for complete search history.

(56) References Cited

U.S. PATENT DOCUMENTS

| | | | |
|---|---|---|---|
| 4,435,786 A | 3/1984 | Tickle | |
| 5,757,696 A | 5/1998 | Matsuo et al. | |
| 7,427,797 B2 * | 9/2008 | Ohguro et al. | 257/415 |
| 2003/0042528 A1 | 3/2003 | Forbes | |
| 2005/0227428 A1 * | 10/2005 | Mihai et al. | 438/222 |
| 2006/0284239 A1 | 12/2006 | Park et al. | |

FOREIGN PATENT DOCUMENTS

FR    2 877 770    5/2006

(Continued)

OTHER PUBLICATIONS

A. M. Ionescu, et al. "Modeling and Design of a Low-Voltage SOI Suspended-Gate MOSFET (SG-MOSFET) with a Metal-Over-Gate Architecture", IEEE International Conference Symposium on Quality Electronic Design, 2002, pp. 18-21.

(Continued)

*Primary Examiner*—Ngan Ngo
*Assistant Examiner*—Benjamin Tzu-Hung Liu
(74) *Attorney, Agent, or Firm*—Oblon, Spivak, McClelland, Maier & Neustadt, L.L.P.

(57) ABSTRACT

A microelectronic device, including at least one transistor including: on a substrate, a semiconductor zone with a channel zone covered with a gate dielectric zone, a mobile gate, suspended above the gate dielectric zone and separated from the gate dielectric zone by an empty space, which the gate is located at an adjustable distance from the gate dielectric zone, and a piezoelectric actuation device including a stack formed by at least one layer of piezoelectric material resting on a first biasing electrode, and a second biasing electrode resting on the piezoelectric material layer, wherein the gate is attached to the first biasing electrode and is in contact with the first biasing electrode, and the piezoelectric actuation device is configured to move the gate with respect to the channel zone.

24 Claims, 16 Drawing Sheets

FOREIGN PATENT DOCUMENTS

WO     WO 2007/149003 A1     12/2007

OTHER PUBLICATIONS

H. Kam, et al. "A New Nano-Electro-Mechanical Field Effect Transistor (NEMFET) Design for Low-Power Electronics", IEDM Technical Digest, 2005, pp. 463-466.

N. Abelé, et al. "Ultra-Low Voltage MEMS Resonator Based on RSG-MOSFET", MEMS, 2006, pp. 882-885.

N. Abelé, et al. "1T MEMS Memory Based on Suspended Gate MOSFET", IEDM, 2006, 4 Pages.

K. Takeuchi, et al. "A Study of the Threshold Voltage Variation for Ultra-Small Bulk and SOI CMOS", IEEE TED, vol. 48, No. 9, Sep. 2001, 7 Pages.

M. Yamaoka, et al. "Low Power SRAM Menu for SOC Application Using Yin-Yang-Feedback Memory Cell Technology", Symposium on VLSI Circuits, Digest of Technical Papers, Jun. 2004, 4 pages.

Asghar Ramezani, et al., "Influence of van der Waals force on the pull-in parameters of cantilever type nanoscale electrostatic actuators", Microsystem Technologies, vol. 12, 2006, pp. 1153-1161.

W Merlijn van Spengen, et al., "A physical model to predict stiction in MEMS", Institute of Physics Publishing, Journal of Micromechanics and Microengineering, vol. 12, (2002), pp. 702-713.

Y-P. Zhao, et al., "Mechanics of adhesion in MEMS-a review", J. Adhesion Sci. TechnoL., vol. (17), n°4, pp. 519-546.

Sreedhar Natarajan, et al., "Emerging Memory Technologies-Mainstream or Hearsay?", VLSI Design Automation and Test, 2005, pp. 222-228.

U.S. Appl. No. 12/169,264, filed Jul. 8, 2008, Thomas, et al.

* cited by examiner

SUSPENDED-GATE MOS TRANSISTOR WITH NON-VOLATILE OPERATION

TECHNICAL FIELD

This invention relates to the field of microelectronics and integrated circuits, and more specifically to the field of transistors.

It relates to a microelectronic device, equipped with a new suspended-gate transistor structure, and equipped with means for piezoelectric actuation of the gate. This device has the advantage of being capable of non-volatile operation.

The invention also includes a method for producing such a device.

PRIOR ART

So-called "suspended"-gate transistors, in which the gate is separated from the channel, and comprising an empty space between at least a portion of the gate and the gate dielectric exist.

In a suspended-gate MOS transistor (MOS for "Metal Oxide Semiconductor"), the gate is separated from the gate dielectric layer and consists of a mobile and/or deformable structure.

A movement of the gate in a direction normal to the surface of the gate dielectric causes a variation in the electrical characteristics of the MOS transistor.

This effect has already been used in various applications, for example in the fabrication of sensors such as accelerometers, pressure sensors and position sensors, in which the movement and/or the deformation of the gate is induced by a mechanical force outside the sensor, induced for example by an acceleration or a movement. In an accelerometer, a movement can induce a variation of the current passing through the channel of the transistor. A measurement of this current variation can then make it possible to obtain the quantity to be measured with the sensor. Such sensors have been implemented in the form of MEMS (MEMS for "Micro Electromechanical Systems"). With these sensors, the current in the transistor channel varies in real time or at the same time as the force applied to the gate. On stopping this external mechanical force, the device returns to an initial operating state, which serves as a reference.

Devices in which the movement and/or the deformation of the gate are induced using an electrostatic force applied to a suspended gate have also appeared.

Documents [1] and [2] (referenced at the end of this description) propose the fabrication of a suspended gate in order to make it possible to improve the electrical performances of a transistor, in particular its sub-threshold slope.

Document [2] proposes in particular an electrostatically actuated suspended-gate transistor, on a MOS accumulation-mode transistor. Just as in the MOS transistor structures operating in inversion mode, such a transistor has a volatile character and loses its data when its power supply is stopped.

Document [3] proposes the fabrication of RF devices such as low-voltage electromechanical resonators or switches, comprising suspended-gate transistors.

Document [4] discloses a volatile storage cell with a single MOS transistor equipped with a suspended gate.

In all of the suspended-gate devices equipped with an electrostatic actuator, the position of the suspended gate is capable of changing when the power supply of the device is cut off.

It is also difficult, in suspended-gate devices in general, to find a compromise between the small sizes required for the transistor gate with the easy actuation of the latter.

Thus, the problem arises of obtaining a new suspended-gate transistor device that does not have the disadvantages mentioned above.

DESCRIPTION OF THE INVENTION

The invention relates to a microelectronic device equipped with at least one transistor comprising:
  on a substrate, a semiconductor zone with a channel covered with a gate dielectric zone,
  a mobile gate, suspended above the gate dielectric and separated from the gate dielectric, which gate is located at an adjustable distance from said gate dielectric zone,
  piezoelectric actuation means, which piezoelectric actuation means are capable of moving the gate with respect to said channel zone.

A new transistor structure with electrical performances that can be modulated with a suspended gate and means for piezoelectric actuation of said gate is implemented according to the invention.

Such a device makes it possible to obtain a threshold voltage $V_T$ of the adjustable transistor.

Such a device can have a non-volatile operation, and maintain an operating mode of the transistor, for example a high $V_T$ or a low $V_T$ after biasing extinctions or power supply cut-offs of the actuator. When the transistor is biased again, it is capable of adopting the operating mode in which it was left before the biasings were stopped.

In such a device, the performances of the transistor can also be improved with respect to those of a classic MOS transistor. The $I_{ON}$ current in the on state can be higher, while the $I_{OFF}$ state in the off state can be lower, which makes it possible in particular to reduce consumption.

The piezoelectric actuation means can include a stack formed by at least one layer of piezoelectric material resting on a first biasing electrode, and a second biasing electrode resting on the piezoelectric material layer.

The gate can be attached to said stack and suspended over said stack.

According to the external electric field applied on it by means of electrodes, the piezoelectric layer is capable of being deformed. The piezoelectric layer can be compressed or bend so as to move the gate attached thereto.

In the proposed transistor structure, the lower biasing electrode of the piezoelectric material layer can be in contact with the gate over the entire width of the latter, which can make it possible to have a reduced gate biasing time.

The piezoelectric material layer can also protect the gate from radiation outside of the device. This can be useful, in particular for applications for example in the aeronautics or space fields, in which the device would be designed to undergo strong radiation.

According to a possibility, the gate can be connected to, and in contact with, said second electrode. The second electrode and the gate can thus be set at the same electric potential.

The gate and the gate dielectric zone can be separated by a modulable empty space.

The gate can be located in a cavity formed between said stack and said substrate. This can make it possible to facilitate the deformation of the piezoelectric layer.

The device can also include: at least one insulating support element around said stack, for holding said stack above the substrate, while preventing the formation of short-circuits.

According to a possible implementation, the device can comprise a plurality of insulating elements for supporting said stack, including at least one support element against a flank of said stack and at least one other support element against another flank of said stack. Said stack can thus be supported by its lateral faces.

According to a possibility, said stack can include on or more free lateral faces or flanks. This can enable an improved deformation of the piezoelectric layer.

The microelectronic device can also include:

a plurality of conductive pads including:
- at least one first conductive pad connected to the source region of said transistor,
- at least one second conductive pad connected to the drain region of said transistor,
- at least one third conductive pad connected to the gate of said transistor, which third pad is in contact with the first electrode or the gate.

The microelectronic device can also include: at least one fourth conductive pad connected to the second electrode.

According to an alternative implementation, said first pad or said second pad is also connected to the second electrode. In this case, the second electrode of the piezoelectric means and the source or drain of the transistor can be set at the same biasing potential.

The conductive pads are capable of being connected to biasing means.

The microelectronic device is capable of adopting at least one first position in which the gate is located at a first distance from the channel, and of adopting at least one second position in which the gate is located at a second distance from the channel, different from the first distance.

The change from the first position to the second position can be implemented with an adapted biasing of the piezoelectric actuation means. An electrostatic adhesion effect resulting from the potential difference between the gate and the channel of the transistor can also be used.

The first position of the piezoelectric layer can be a position in which the piezoelectric layer is planar, or substantially planar, or is not, or is slightly deformed, and the gate is at a predetermined distance from the channel.

The second position can be a position in which the piezoelectric layer is bent, and the gate is in contact with the gate dielectric zone. To hold the gate of the transistor in this second position, an adhesion force also called "molecular bonding" force can be implemented. Such an adhesion or such a molecular bonding is produced by attractive forces, for example, such as Van der Waals forces.

Power supply means capable of powering the transistor and the actuation means can be provided. According to a possible implementation, the device is capable of adopting a given position among said first and second positions, and also capable of holding the gate in said given position after said power supply means have been stopped or cut off. The gate can be held in position after all of the biasings of the device have been set at zero potential.

According to a possible implementation of the microelectronic device, the latter can be capable of adopting a state in which the piezoelectric actuation means are in a given biasing state, and in which the gate is held by the piezoelectric actuation means in contact with the gate dielectric, and also of adopting another state in which the piezoelectric actuation means are not biased, i.e. set at zero potential, and in which the gate is held by molecular bonding, under the effect of forces such as Van der Waals forces, in contact with the gate dielectric. By "non-biased" actuation means, we mean that the electrodes are set at zero potential.

According to a possible implementation of the device, the latter is capable of adopting a state in which the piezoelectric actuation means are set in a biasing state, making it possible to separate the gate from the gate dielectric.

The dimensioning of the elements of the device is intended to enable the gate to preserve its position if all of the biasings of the device, in particular those of the piezoelectric actuation means and the transistor, are stopped or cut off.

The invention also relates to the implementation of non-volatile storage cells, including a device as defined above.

This invention also relates to a method for producing a microelectronic device equipped with at least one suspended mobile gate transistor with piezoelectric actuation, including the steps of:

a) forming, on a substrate, at least one semiconductor zone in which source, drain and channel zones of a transistor are intended to be formed, and a gate dielectric zone covering said semiconductor zone, b) forming at least one sacrificial layer on said gate dielectric zone, c) forming a gate for said transistor on said sacrificial layer, d) forming, on the gate, a stack including at least one first conductive layer intended to form a first electrode, with at least one piezoelectric material layer resting on said first conductive layer, and at least one second conductive layer on said piezoelectric material layer and intended to form a second electrode, in which said stack is intended for the formation of means for piezoelectric actuation of the gate, e) at least partially removing said sacrificial layer on the gate dielectric zone, so as to detach the gate from the gate dielectric.

According to a possibility, the method can include, after step c), and prior to step e), the steps of:
- forming a second sacrificial layer around the gate, on which said stack is intended to be produced, then, after step d):
- etching said stack and the second sacrificial layer, so as to form at least one block.

After the step of forming said block and prior to step e), the method can also include the formation of a so-called insulating "support" layer around said block, against the lateral faces of said stack.

According to a possible alternative, after step c) and prior to step d), the method can include the etching of the insulating "support" layer so as to preserve at least one first support element against at least one first lateral face of said stack, and at least one second support element against at least one second lateral face of said stack.

Said block can have a rectangular shape, with the etching of the insulating support layer being performed so as to free the two other lateral faces of said stack.

After the step of forming said block and prior to step e), the method can also include: the fabrication of openings through said stack, of which at least one first opening exposes the source zone, and at least one second opening exposes the drain zone.

According to a possibility, the method can also include: the fabrication of at least one third opening exposing said first conductive layer or the gate.

After the step of producing the openings and prior to step e), the method can include a step of filling said openings with at least one insulating material.

After the step of filling the openings, the method can also include steps of:

producing, in said insulating material, holes of critical dimension smaller than the critical dimension of the openings, including at least one first hole in said first opening and exposing said source zone, at least one second hole in said second opening and exposing said drain zone, and at least one hole in said third opening and exposing said first conductive layer or the gate, filling the holes with a conductive material, so as to form conductive pads, including at least one first pad in contact with said source zone, at least one second contact pad in contact with said drain zone, and at least one third pad in said third opening in contact with said first conductive layer or the gate.

The method can include, after the step of filling the openings:

the fabrication of at least one fourth hole exposing the second conductive layer, the filling of the fourth hole with at least one conductive material, so as to form a conductive pad in contact with the second conductive layer.

According to an alternative, after said step of producing the holes, the method can include: a step of enlarging the opening of the first hole or of the second hole, so as to expose the second conductive layer, said step of filling the holes, thus leading to the formation of at least one first pad in contact with said source zone and the first conductive layer, or to the formation of at least one second pad in contact with said drain zone and the second conductive layer.

According to another alternative of the method, said method can also include, after said step of filling the holes, steps of:

forming an additional hole, near the first pad or the second pad, and exposing the second conductive layer, filling the additional hole with a conductive material.

After step d) and prior to step e), the method can include the fabrication of at least one opening through the block exposing the sacrificial layer and the second sacrificial layer.

In step e), the sacrificial layer and the second sacrificial layer can be etched through said opening.

According to a possibility, the sacrificial layer can be based on a material capable of being etched selectively at least with respect to the gate dielectric and the gate material.

The second sacrificial layer can be based on a material capable of being etched selectively at least with respect to the gate dielectric and the gate material.

According to a possible implementation of the method, the sacrificial layer and the second sacrificial layer can be based on the same material.

The method can include, between step c) and step d), the formation of insulating spacers against the flanks of the gate.

BRIEF DESCRIPTION OF THE DRAWINGS

The present description can be better understood on reading the following description of example embodiments provided for indicative and non-limiting purposes, in reference to the appended drawings in which:

FIGS. 7A to 7J show, in a cross-section view, steps of an example embodiment of a microelectronic device according to the invention, while FIGS. 9A to 9D show, in a cross-section view, steps of an alternative embodiment of a microelectronic device according to the invention, while FIGS. 11A to 11C show, in a cross-section view, steps of another alternative embodiment of a microelectronic device according to the invention, while

Identical, similar or equivalent parts of the various figures have the same numeric references for the sake of consistency between figures.

The various parts shown in the figures are not necessarily shown according to a uniform scale, in order to make the figures easier to read.

DETAILED DESCRIPTION OF SPECIFIC EMBODIMENTS

Figure 1:
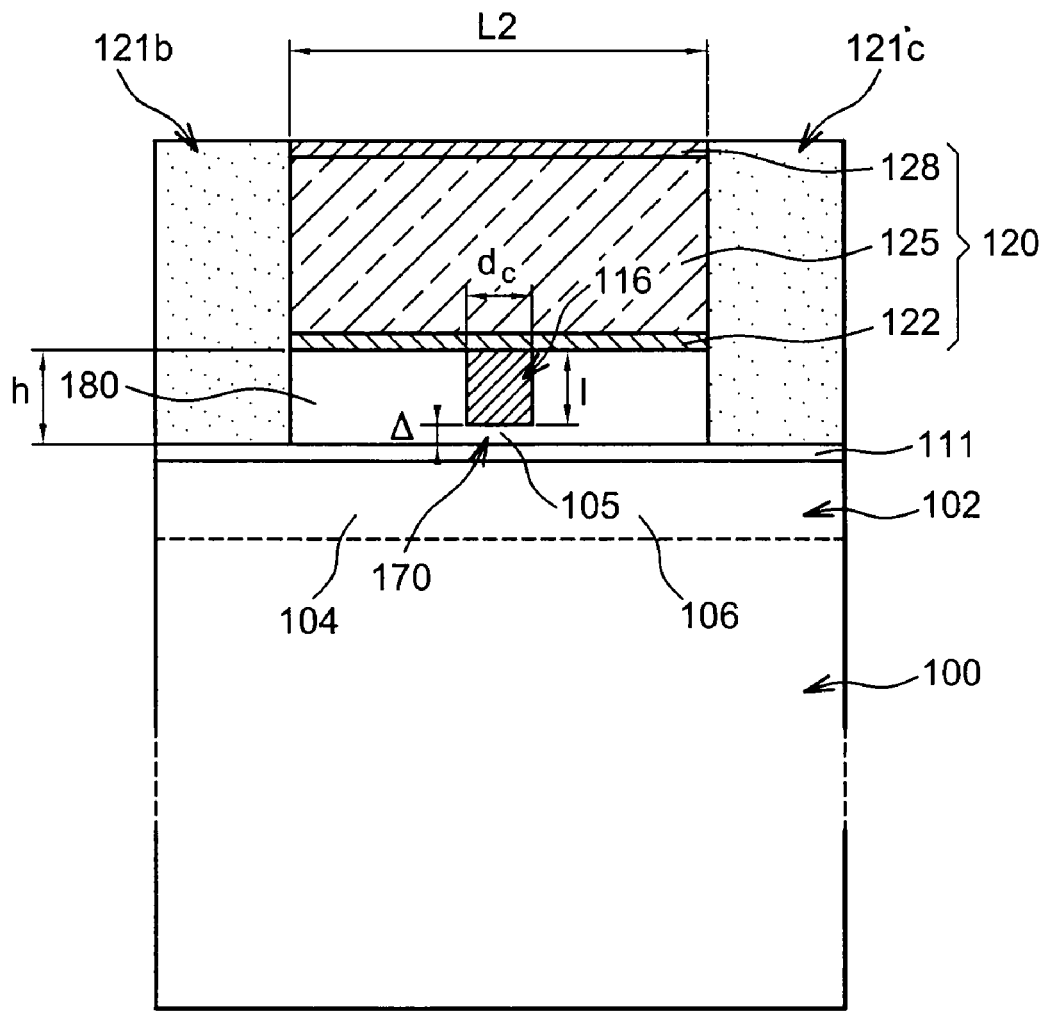
FIG. 1 shows an example of a microelectronic device according to the invention, including a suspended-gate transistor and piezoelectric actuation means, capable of moving the gate of the transistor with respect to the gate dielectric and the channel of the transistor.
Figure 1:
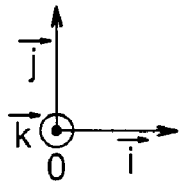

An example of a microelectronic device according to the invention will now be provided in reference to FIG. 1.

This device includes a transistor structure resting on a substrate 100, which can be of the semiconductor on insulator type, for example a SOI substrate comprising a fine semiconductor layer in which a semiconductor zone 102, for example made of monocrystalline silicon, capable of acting as an active zone, has been produced.

The device according to the invention is not limited to such a substrate and can be formed, for example, on a massive substrate or on a limited substrate. The semiconductor zone 102 has a source region 104 and a drain region 106 on each side of a channel zone 105 of the transistor. The semiconductor zone 102 can have a length L1 (defined in FIG. 1 in a direction parallel to the vector $\vec{i}$ of an orthogonal reference point [O; $\vec{i}$; $\vec{j}$; $\vec{k}$]). The length $L_1$ of the semiconductor zone 102 can be, for example, equal to the distance separating two isolation trenches STI (STI for "shallow trench isolation").

A gate dielectric layer 111 covers the semiconductor zone 102 and can be distributed over the entire length thereof. The gate dielectric layer 111 can be based, for example, on $SiO_2$ or a material with high dielectric permittivity or "high-k", such as, for example, $HfO_2$. The gate dielectric layer 111 can have a thickness of, for example, between 1 nanometer and 10 nanometers, for example on the order of 2 nanometers.

The transistor comprises a suspended gate 116. The gate 116 is not secured, or is not attached to the gate dielectric layer 111. The device is capable of adopting at least one position in which the gate 116 is located at a distance from the gate dielectric layer 111, so that there is a space 170 between the gate 116 and the gate dielectric layer 111. The gate 116 and the gate dielectric layer 111 can be separated by a distance Δ (defined in FIG. 1 in a direction parallel to the vector $\vec{j}$ of a modulable or adjustable orthogonal reference point [O; $\vec{i}$; $\vec{j}$; $\vec{k}$]).

The gate 116 can be formed by a semiconductor material, for example polycrystalline silicon, or a metal such as TiN or TaN or a bilayer made of a metal layer covered with a silicon layer, for example based on polysilicon. The gate 116 has a critical dimension dc (defined in FIG. 1, in a direction parallel to the vector $\vec{i}$) for example between several nanometers and several micrometers, for example on the order of 20 nanometers.

Throughout the remainder of this description, the term "critical dimension" will refer to the smallest dimension of a pattern of a layer or a plurality of thin layers outside of the thickness of said layer(s). It is thus possible to implement a gate of low critical dimension, for example smaller than 100 nanometers, without adversely effecting the operation of the device.

The gate 116 can also have a thickness e (defined in a direction parallel to the vector $\vec{j}$), for example between 20 nanometers and several times the critical dimension of the gate, for example on the order of 50 nanometers. The gate 116 is suspended and attached by its upper face to piezoelectric actuation means.

The distance between the gate 116 and the channel 102 can be modulated by the piezoelectric actuation means. The piezoelectric actuation means are capable of moving the gate 116 with respect to the channel 105 of the transistor. The gate 116 is capable of adopting a plurality of positions with respect to the channel 105. By piezoelectric actuation, we mean a movement of the gate due to a deformation of the piezoelectric layer 125 and its associated electrodes 122, 128 by an inverse piezoelectric effect.

The piezoelectric actuation means 120 can include a stack 120 formed by a lower electrode 122 to which the gate 116 can be connected, a piezoelectric material layer 125 resting on the lower electrode 122, and an upper electrode 128 resting on the piezoelectric material layer 125.

The lower electrode 122 and the upper electrode 128 can be in the form of etched conductive layers, and are intended to form biasing electrodes of the piezoelectric material layer 125. The lower electrode 122 and the upper electrode 128 can have a thickness of between, for example, 10 nanometers and 100 nanometers, for example on the order of 10 nanometers. The piezoelectric material layer 125 can have a thickness of between, for example, 100 nanometers and 1 micrometer, for example on the order of 150 nanometers.

The stack 120 formed by the piezoelectric layer 125 situated between the two electrodes 122 and 128 can have a length L2 provided so as to enable it to be deformed, advantageously greater than the critical dimension dc of the gate, for example, such as L2~10*dc.

The stack 120 can be in the form of a block with a rectangular pattern, having a length L2, for example on the order of 600 nanometers (defined in FIG. 1 in a direction parallel to the vector $\vec{i}$) and a width W2, for example on the order of 1000 nanometers (defined in FIG. 1 in a direction parallel to the vector $\vec{k}$).

The piezoelectric material of the layer 125 can be, for example AlN, ZnO, LiNbO$_3$, or LiTaO$_3$. The choice of piezoelectric material can be provided in particular so that said material has a low dielectric constant. The layer 125 can be based on a piezoelectric material with a relative permittivity $\in_R$~ 10 such as the AlN, the ZnO, or $\in_R$~ 25 such as LiNbO$_3$ or $\in_R$~ 43 such as LiTaO$_3$. With regard to the mechanical properties of the piezoelectric material, the material of the layer 125 is chosen to be flexible enough to be capable of enabling the layer 125 to be deformed under the effect of biasing, and to move the gate 116 in order to put it in contact with the gate dielectric 111, and rigid enough so that, under the effect of another biasing, the piezoelectric layer 125 is again deformed so as to impose a return force on the gate 116, when the latter is bonded to the surface of the dielectric 111.

The choice of the materials of each of the electrodes 122 and 128 can also be made according to the desired rigidity of the structure. The piezoelectric coefficients of the material of the layer 125, and in particular its longitudinal piezoelectric coefficient $e_{33}$, are preferably as high as possible. The longitudinal piezoelectric coefficient $e_{33}$ is defined as the coefficient representing a constraint of the layer 125 in a direction parallel to the biasing vector of said layer 125. According to the arrangement of the layer 125 and the electrodes 122, 128, the biasing vector is defined in a direction (parallel to the vector $\vec{j}$ in FIG. 1) orthogonal to the plane of the electrodes. The longitudinal piezoelectric coefficient $e_{33}$ of the piezoelectric layer 125 can, for example, be on the order of 1.5 C/m$^2$. The piezoelectric coefficients of the material of the layer 125, and in particular its longitudinal piezoelectric coefficient $e_{33}$, is preferably greater than a predetermined minimum value, corresponding to the value for which the piezoelectric force added to the return force exerted by the structure on the gate of the device enables the detachment of the gate if the gate is bonded to the surface of the gate dielectric.

The device can be dimensioned on the basis of dimensions chosen for the gate 116, in particular the critical dimension of the gate dc and its thickness e. For a given gate critical dimension dc, the length L2 of the stack 120 can be chosen preferably so that L2>dc.

For example, when dc is on the order of 40 nm, L2 can be, for example, on the order of 400 nm, i.e. a L2/dc ratio on the order of 10 or 12, for example.

The device also comprises one or more elements 121b, 121c for supporting the stack 120 of the piezoelectric actuator, located at the periphery thereof. The support elements 121b, 121c can be in the form of insulating blocks on which the lateral faces of the stack 120 are supported, and which hold said stack 120 above the substrate 100. The support elements 121b, 121c are preferably made on the basis of at least one insulating material, such as, for example SiO$_2$, or Si$_3$N$_4$, or a stack of SiO$_2$ and Si$_3$N$_4$ so as to prevent the formation of short-circuits. The insulating material of the support elements 121b, 121c is preferably chosen so as to have a stiffness greater than that of the stack 120, so as, preferably, to preserve maximum rigidity when the piezoelectric layer 125 is deformed.

Pads (not shown in FIG. 1) are also provided in order to produce the contacts of the transistor. One or more conductive pads can also be provided in order to produce the contacts of the piezoelectric actuator. Conductive pads can be provided in order to connect or electrically link, respectively, the source zone 104 to source biasing means, the drain zone 106 to drain biasing means 106, the gate 116 and the lower electrode 122 of the stack 120 to biasing means of the gate and the lower electrode 122, and the upper electrode 128 of the actuator to biasing means of the piezoelectric actuator.

An example of the operation of a microelectronic device according to the invention will be provided in reference to FIGS. 2A-2B, 3A-3B and 4A-4B.

Figure 2A:
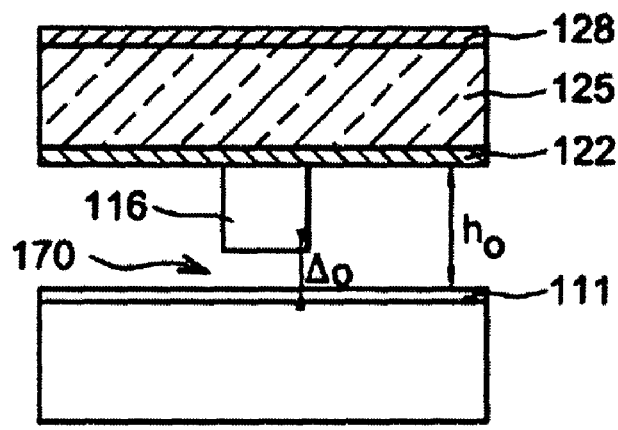
FIGS. 2A and 2B show various positions of a microelectronic device according to the invention, FIGS. 3A and 3B respectively show steps of bonding the gate on the surface of the gate dielectric, and separating the gate from the surface of the gate dielectric, of a suspended-gate transistor with piezoelectric actuation according to the invention.

The device can adopt a so-called "resting" position in which the stack 120 is suspended above and at a so-called "resting" height h0 from the gate dielectric layer 111. In the resting position, the gate 116 is located at a so-called "resting" distance Δ0 from the dielectric 111, so that there is an empty space 170 between the gate 116 and the gate dielectric zone 111. The piezoelectric layer 125 can be planar in the resting position. In the resting position, the power supply of the actuation means and the transistor is off, so that all of the biasings are at zero potential (FIG. 2A).

When they are biased, the piezoelectric actuation means can actuate the gate 116, and make it possible to move the latter. According to the direction of the external electric field applied thereon by means of electrodes 122, 128, this piezoelectric layer 125 is capable of being compressed or of relaxing, and thus of moving the gate 116 connected thereto.

In addition to the inverse piezoelectric effect, an effect of electrostatic attraction resulting from the difference in potential between the gate 116 and the channel 105 of the transistor is capable of being implemented. This electrostatic attraction involves an electrostatic force tending to bring the gate 116 of the channel 105 of the transistor closer, and which can make it possible to place the gate 116 in contact with the gate dielectric 111.

An additional so-called adhesion or molecular bonding force can also be implemented. Molecular bonding, in particular of the Van der Waals type, is capable of being exerted between the lower face of the gate 116 and the gate dielectric surface 111. The implementation of this additional force is dependent in particular of the planarity of the lower face of the gate 116 and the surface opposite the gate dielectric 111, as well as a dimensioning adapted to the elements of the structure. The implementation of the adhesion or molecular bonding force is described, for example, in the following documents: the article of Asghar Ramezani et al.: "*Influence of Van Der Waals Force on the Pull-In Parameters of Cantilever Type Nanoscale Electrostatic Actuators*", Microsystem Technologies, 2006, vol. 12, pages 1153-1161; the article of W. Merlijn van Spengen et al.: "*A Physical Model to Predict Stiction in MEMS*", Institute of Physics Publishing, Journal of Micromechanics and Microengineering, 12, (2002), pages 702-713; and the article of Y.-P. ZHAO et al.: "*Mechanics of Adhesion in MEMS—a Review*", J. Adhesion Sci. Technol. Vol. 17, no. 4, pages 519-546. By comparison with the other forces to which the gate is subjected, the adhesion or molecular bonding force increases as the gate is closer to the gate dielectric.

The implementation of the adhesion or molecular bonding force makes it possible to confer a non-volatile operation on the device. This is capable of being held in a given position when the power supply and the biasings of the actuator and the transistor are stopped. When the biasings are off, the gate 116 is capable of being held in contact with the gate dielectric 111. When the transistor is again biased, it is capable of adopting the same operating mode as the one in which it was left before the biasings were stopped.

Figure 2B:
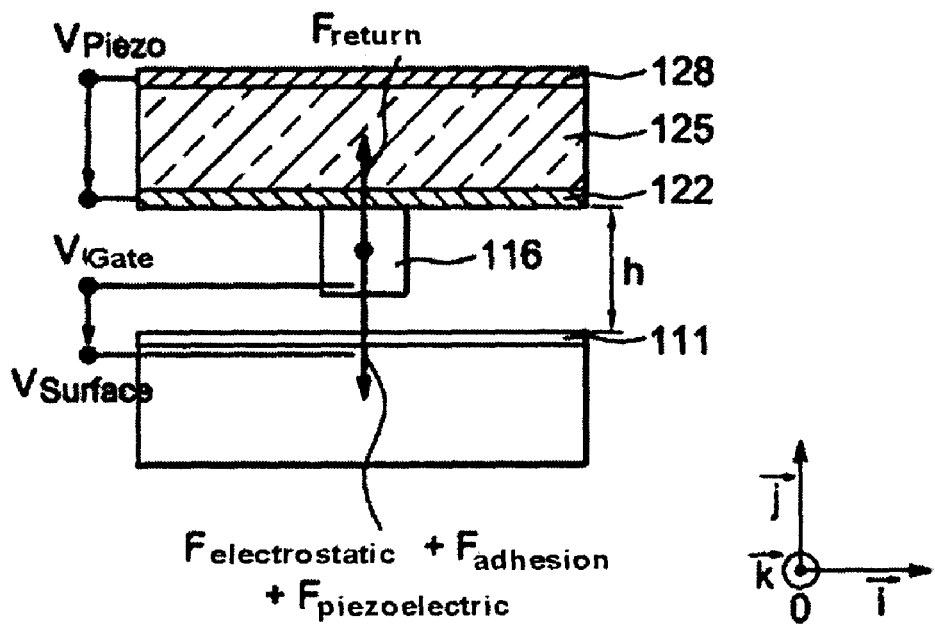
Figure 3A:
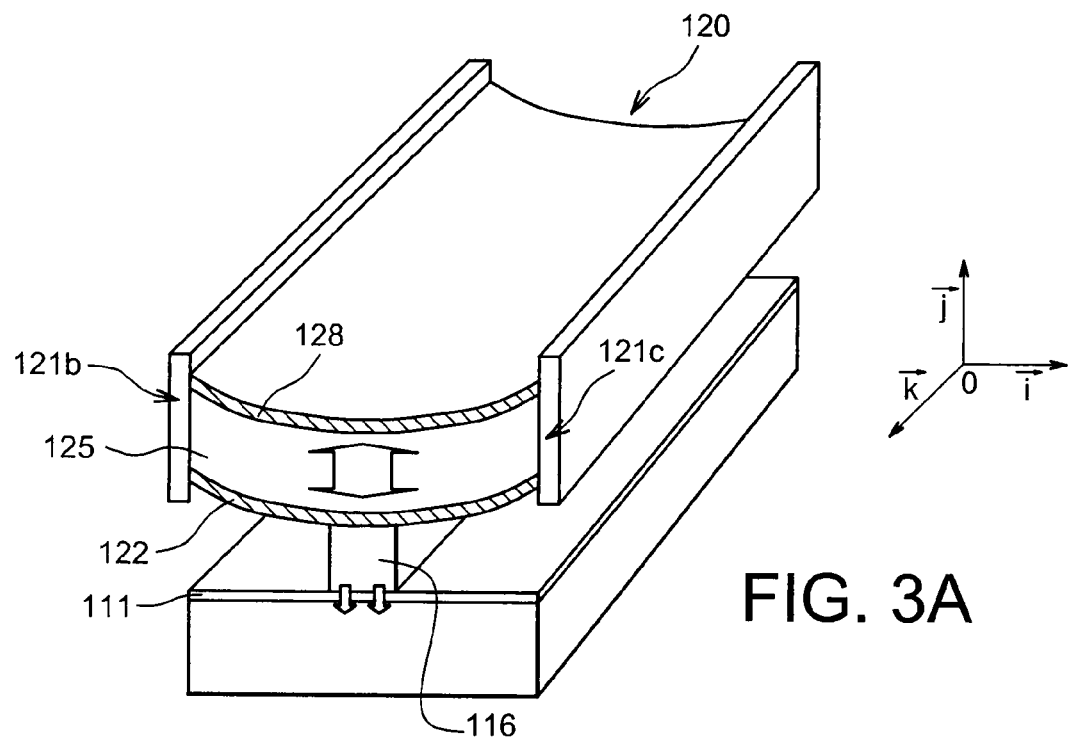
Figure 3B:
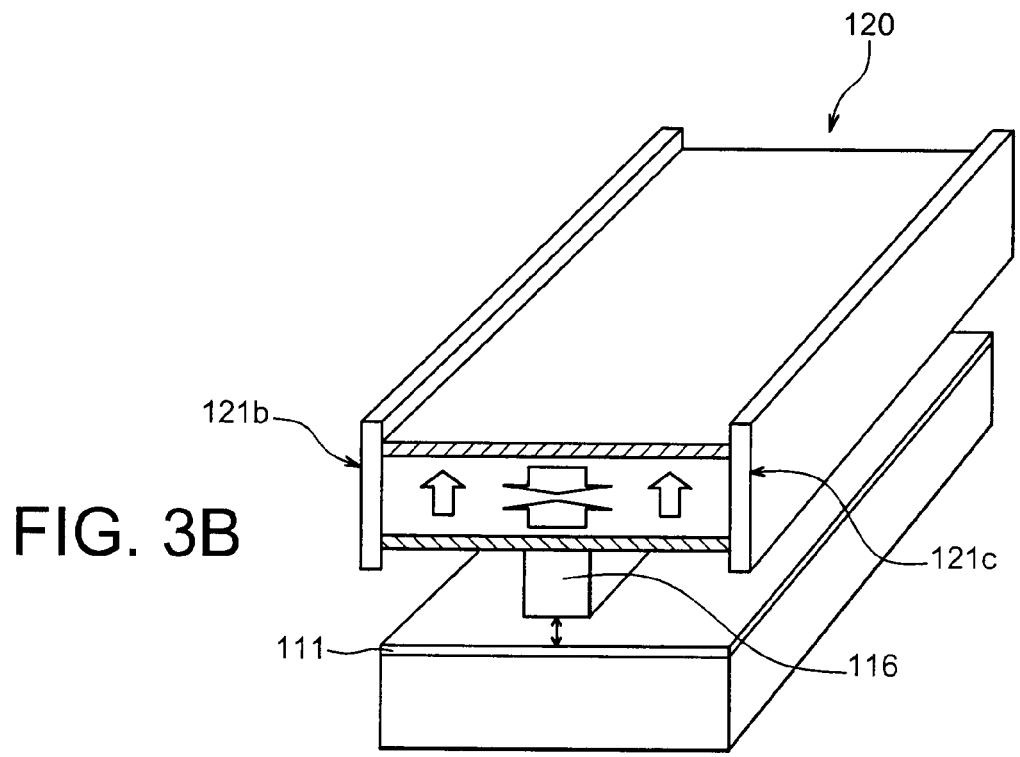

In FIG. 2B, the device is put in a biasing state different from that of the resting position, and for which the device adopts a first position in which the gate 116 is not in contact with the surface of the gate dielectric layer 111, with the gate 116 being kept at a non-zero distance $\Delta$ from the gate dielectric layer 111. In order for the device to adopt the first position, the piezoelectric means are placed in an adapted biasing state, and a non-zero potential is applied to the electrodes. The suspended gate 116 of the transistor can then be subjected to four forces, including a first force or electrostatic force $F_{electrostatic}$ due to the difference in potential present between the gate and the surface of the transistor channel, a second force or piezoelectric force $F_{piezoelectric}$, generated by the difference in potential applied between the two biasing electrodes 122, 128 of the piezoelectric layer, a third or return force $F_{return}$, corresponding to the stiffness of the mechanical support of the gate 116, i.e. the stiffness of the stack formed by the piezoelectric layer 125 and the electrodes 122, 128, and the insulating support elements or layer of the stack, and a fourth molecular bonding or adhesion force $F_{adhesion}$, resulting in particular from Van der Waals forces exerted between the lower face of the gate 116 located opposite the gate dielectric layer 111 and the surface of the gate dielectric layer 111. In the first position, the biasing state of the electrodes of the actuation means is adapted so that:

$$|F_{electrostatic}|+|F_{adhesion}|<|F_{return}|+|F_{piezoelectrique}|$$

A different biasing of the piezoelectric actuation means can make it possible to move the latter. The fourth force can become significant when $\Delta$ is reduced, for example below 1 nm. A bonding (FIG. 3A) of the gate 116 to the dielectric layer 111 can be performed when the following condition is implemented:

$$|F_{piezoelectric}|+|F_{electrostatic}|+|F_{adhesion}|>|F_{return}|$$

A predetermined dimensioning of the elements of the device and an adapted biasing can make it possible to satisfy this condition.

In the bonding position, the gate 116 is in contact with the surface of the gate dielectric 111. When the device is biased, the gate 116 of the transistor is subjected, in a first approximation, to the four forces presented above for the bonding mechanism.

A detachment (FIG. 3B) of the gate 116 is implemented when the following condition is verified:

$$|F_{piezoelectric}|+|F_{return}|>|F_{electrostatic}|+|F_{adhesion}|$$

A predetermined dimensioning of the elements of the device and an adapted biasing can make it possible to satisfy this condition.

It may be desirable to preserve the operating state of the transistor, even after stopping all of the biasing or power supplies, so as to confer a non-volatile operation on the device.

To do this, the gate 116 can be held, after stopping the biasing, in a position that it was in before said stop. When the biasings are off, the gate 116 is subjected only to the return forces of the structure and the adhesion forces at the surface of the gate dielectric 111. The piezoelectric and electrostatic forces dependent on the applied differences in potential become nil.

Two cases of holding the position of the gate 116 can, for example, be carried out.

Figure 4A:
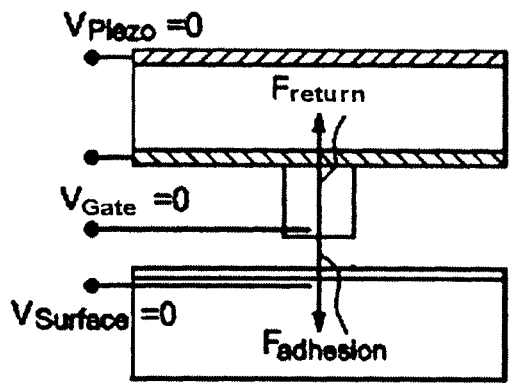
FIGS. 4A and 4B show a non-volatile operation of a microelectronic device according to the invention.
Figure 4B:
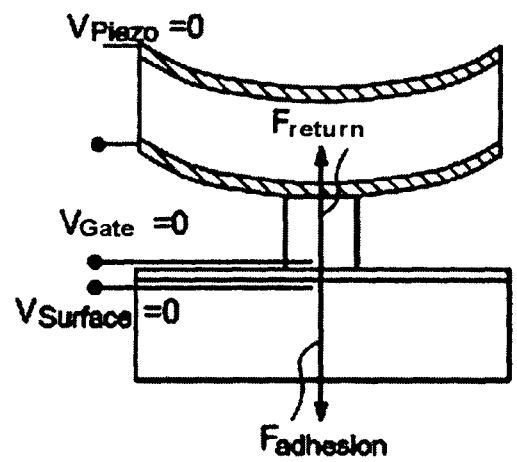

A first case in which the gate is initially separated or at a distance from the gate dielectric 111, and is located for example in the first position before the power supply cut-off or biasing extinction. In this case, after the cut-off or extinction, the adhesion forces are low by comparison with the return forces, which enables the gate 116 to be held in the resting position (FIG. 4A). There can be a slight movement of the gate between the first position, when the stack is biased but held at a distance from the gate dielectric and the "resting" position in which the biasings are off. By "slight movement", we mean a slight movement with respect to the resting distance $\Delta 0$.

A second case in which the gate 116 is initially bonded to, or in contact with, the gate 116 dielectric 111 before the power supply cut-off or biasing extinction. In this case, after the cut-off or extinction, the adhesion forces are non-negligible with respect to the return forces. To keep the gate bonded without biasing, the following condition is implemented:

$$|F_{adhesion}|>|F_{return}|$$

A predetermined dimensioning of the elements of the device, in particular an adapted stiffness of the stack and the piezoelectric layer as well as a chosen resting distance Δ0 can make it possible to satisfy this condition. The piezoelectric actuation means as well as the support elements of the stack have dimensions and a composition that are adapted in order to produce a stiffness at the edge of the stack that enables the condition of holding the gate in said second case described above to be satisfied. Thus, when the piezoelectric actuation means are not biased or powered, the gate 116 is capable of resting in the position in which it is bonded to the dielectric 111, by adhesion forces that vary significantly with the distance separating the gate 116 from the gate dielectric 111, more than the return forces. The return forces can be proportional to this distance while the adhesion forces are inversely proportional to a power of this distance, for example inversely proportional to the cube of this distance for Van der Waals forces.

Figure 5A:
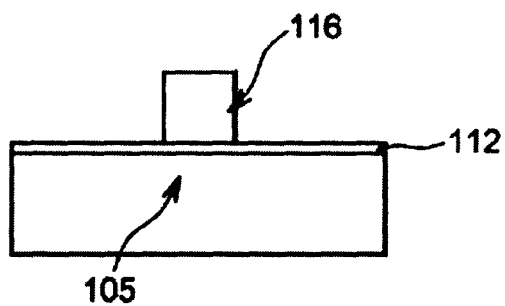
FIGS. 5A and 5B show a modulation of the threshold voltage of the suspended-gate MOS transistor according to the invention.
Figure 5B:
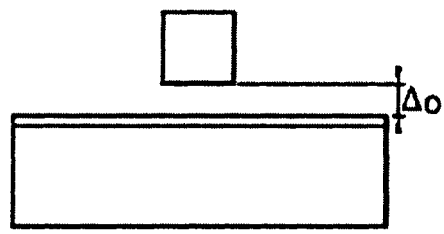
Figure 6:
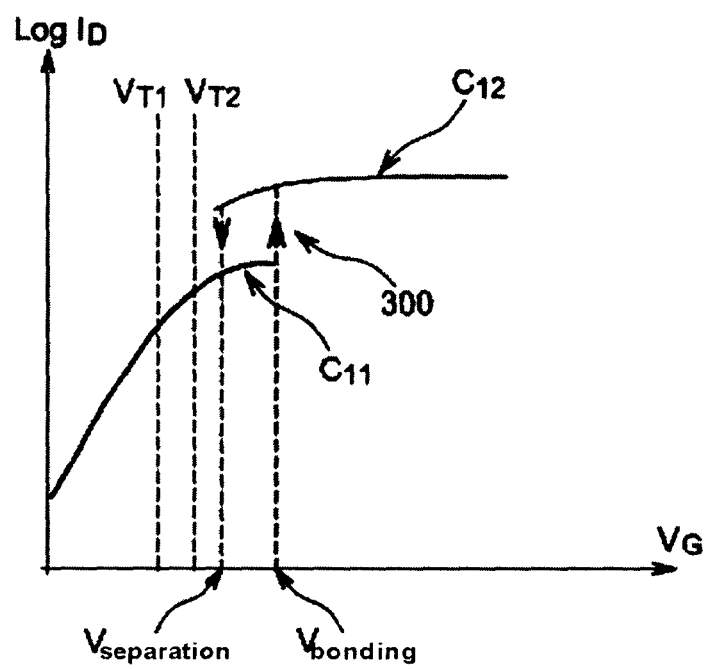
FIG. 6 shows a gate voltage-drain current characteristic of a transistor according to the invention.

An example of the electrical operation of the microelectronic device will now be provided in reference to FIGS. 5A-5B and FIG. 6.

The threshold voltage $V_T$ of the transistor can be modulated by varying the insulating thickness between the gate 116 and the channel 105 of the transistor.

In FIG. 5A, the gate 116 of the transistor is bonded to or is in contact with the gate dielectric 111. The insulating thickness between the gate 116 and the channel 105 thus corresponds to the thickness e1 of the gate dielectric layer. In this position, the transistor has a first threshold voltage $V_{T1}$.

In FIG. 5B, the gate 116 of the transistor is located at a distance Δ from the gate 116 dielectric 111. The insulating thickness between the gate 116 and the channel 105 corresponds to the thickness of the gate dielectric layer added to a thickness Δ of air between the gate 116 and the gate dielectric 111. In this position, the transistor has a second threshold voltage $V_{T2}$.

The transistor can have at least two distinct threshold voltage values:

a low threshold voltage $V_{T1}$ when the gate is in contact with the surface of the gate dielectric (bonded gate),
a high threshold voltage $V_{T2}$ when the gate is not in contact with the surface of the gate oxide (separated gate).

The transistor of the device has a threshold voltage that can be dynamically modified, and have, for example, a first threshold voltage $V_{T1}$, which can be, for example, low when the transistor is on and a second threshold voltage $V_{T2}$ for example such that $V_{T2}>V_{T1}$ and that can be high when the transistor is off. The electrical performances of the transistor are thus improved by comparison with a classic MOS transistor of the same dimensions, insofar as, by comparison with such a transistor, the transistor according to the invention has a higher current $I_{ON}$ circulating in the channel in the on state, and a lower channel current $I_{OFF}$ in the off state.

A characteristic curve representing the drain current as a function of the potential applied to the gate is shown in FIG. 6.

A first portion of the curve $C_{12}$ corresponds to a position in which the gate is bonded to the gate dielectric 111, while another portion of the curve $C_{11}$ corresponds to a position in which the gate is separated or in the resting position.

Such a device is capable of operating at a variable threshold voltage and thus being capable of having a subthreshold slope lower than the limit of 60 mV/dec of the classic single- or double-gate MOS transistor structures.

An example embodiment of a microelectronic device as described above, equipped with a transistor comprising a suspended gate and superimposed with piezoelectric actuation means, will now be provided in reference to FIGS. 7A-7J and 8A-8E (the device being produced is shown according to a transverse cross-section in FIGS. 7A-7J and according to a top view in FIGS. 8A-8E).

In this example, the starting material is a semiconductor-on-insulator-type substrate, such as an SOI substrate (SOI for "Silicon On Insulator"). The method according to the invention is not limited to such a substrate and can be adapted, for example for fabrication on a massive substrate or on a limited substrate. The starting substrate can be formed by a layer 200 of semiconductor material, for example monocrystalline silicon, superimposed by a layer 201 of insulating material, for example silicon oxide, on which a fine layer of semiconductor material, for example monocrystalline silicon, intended to form an active layer, rests.

In the fine layer of semiconductor material, at least one semiconductor zone 202 is defined, for example by etching.

Figure 7A:
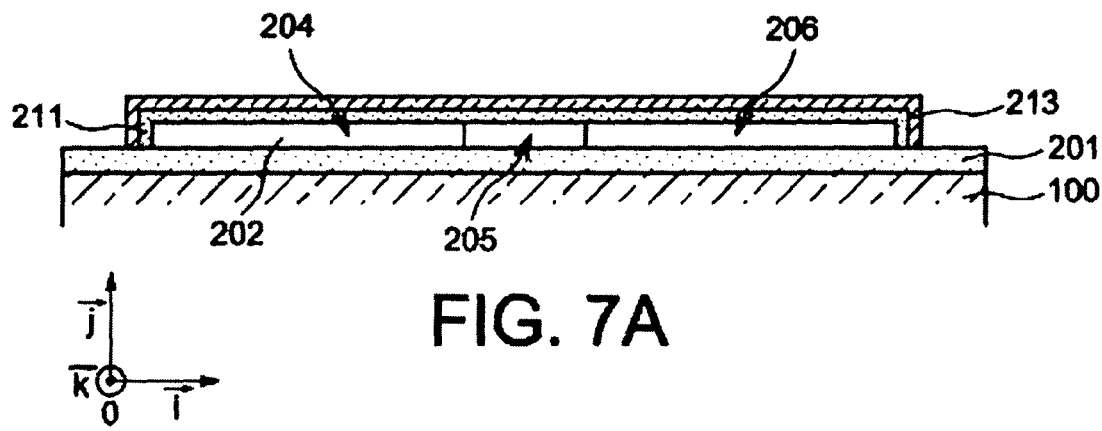

The semiconductor zone 202 can have a length L1 (defined in FIG. 7A in a direction parallel to the plane [0; $\vec{i}$; $\vec{k}$] of an orthogonal reference point [0; $\vec{i}$; $\vec{j}$; $\vec{k}$]), for example on the order of 1 μm.

It is possible then to produce in this semiconductor zone 202, active source 204 and drain 206 zones, on each side of a channel zone 205.

Then, the semiconductor zone 202 is covered with a layer intended to form a gate dielectric zone 211 superimposed by a first sacrificial layer 213. The first sacrificial layer 213 is intended to be removed later in order to detach the future gate of the transistor from the gate dielectric layer 211, and produce an empty space between this future gate and the gate dielectric zone 211.

The gate dielectric zone 211 can be, for example, based on silicon oxide and produced by thermal oxidation of a silicon layer or by deposition of a dielectric material having a high dielectric constant ("high-k") such as $HfO_2$ or $Al_2O_3$ or $HfSiO_x$. The dielectric zone 211 can have a thickness of between, for example, 1 nanometer and 10 nanometers, for example on the order of 2 nanometers.

The sacrificial layer 213 is based on a material capable of being etched selectively with respect to the other materials of the structure. The sacrificial layer 213 is based on a material capable of being etched selectively with respect, in particular, to the dielectric 211 and the future gate. The choice of material of the sacrificial layer 213 can also be made according to the materials of the piezoelectric layer and the elements supporting this layer intended to be produced subsequently, so as to be capable of being etched selectively with respect to this piezoelectric layer and these support elements.

The first sacrificial layer 213 can, for example, be based on Ge or SiGe. According to another example, the first sacrificial layer 213 can be based on $SiO_2$ if the gate dielectric is based on a "high-k" material. The sacrificial layer 213 can have a thickness of between, for example, several nanometers and several dozen nanometers, for example on the order of 4 nanometers (FIG. 7A).

Then, using the deposition, lithography and etching steps, a gate 216 is produced on the basis of at least one gate material, made of metal, for example such as TiN, or of a semiconductor, for example such as polycrystalline silicon, or a stack formed by at least one metal layer and at least one semiconductor layer. The gate 216 can have a thickness of between, for example, 10 nanometers and 1 micrometer, for example on the order of 50 nanometers. The gate 216 can have a critical dimension dc of between, for example, several nanometers and several hundred nanometers, for example on the order of 40 nanometers (defined in FIG. 7A in a direction parallel to the plane [0; $\vec{i}$; $\vec{k}$] of an orthogonal reference point [0; $\vec{i}$; $\vec{j}$; $\vec{k}$]).

It is then possible to produce extension zones, for example by ion implantation.

Then insulating spacers 217a, 217b are formed on each side of the gate 216, based on an insulating material, for example such as $SiO_2$ or $Si_3N_4$ or a stack of these two materials.

It is then possible to dope the semiconductor zone 202, for example by implantation, so as to produce source 204 and drain 206 zones.

Figure 7B:
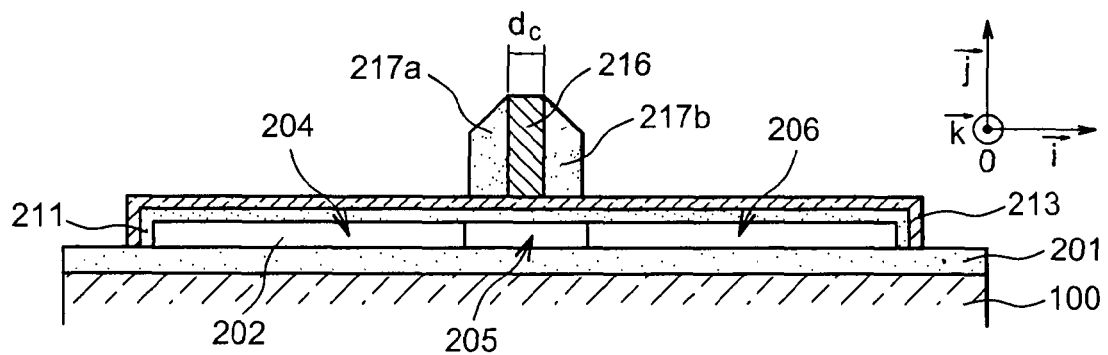

Thus, a structure similar to that of an MOS transistor using SOI technology is formed, but it comprises a sacrificial layer 213 between the gate dielectric zone 211 and the gate 216 (FIG. 7B).

The structure is then covered with a second sacrificial layer 219. This second sacrificial layer 219 can be produced by deposition, then removed in a zone located above the gate 216. The removal of the second sacrificial layer 219 from above the gate can be performed by CMP planarization (Chemical Mechanical Planarization) until the upper face of the gate 216 is exposed. The second sacrificial layer 219 can be based on a material capable of being etched selectively with respect to the other materials of the structure. The second sacrificial layer 219 can be based on a material capable of being etched selectively, in particular with respect to the gate dielectric 211 and the future gate. The choice of the material of the second sacrificial layer 219 can also be made according to the materials of a piezoelectric layer and elements supporting this piezoelectric layer intended to be produced subsequently, so as to be capable of being etched selectively with respect to this piezoelectric layer and these support elements. The second sacrificial layer 219 can, for example, be based on Si. According to a possibility, the sacrificial layer can be based on the same material as the first sacrificial layer, for example SiGe or Ge. The second sacrificial layer 219 can be optionally be based on $SiO_2$ in particular if the gate dielectric is based on a "high-k" material.

Figure 7C:
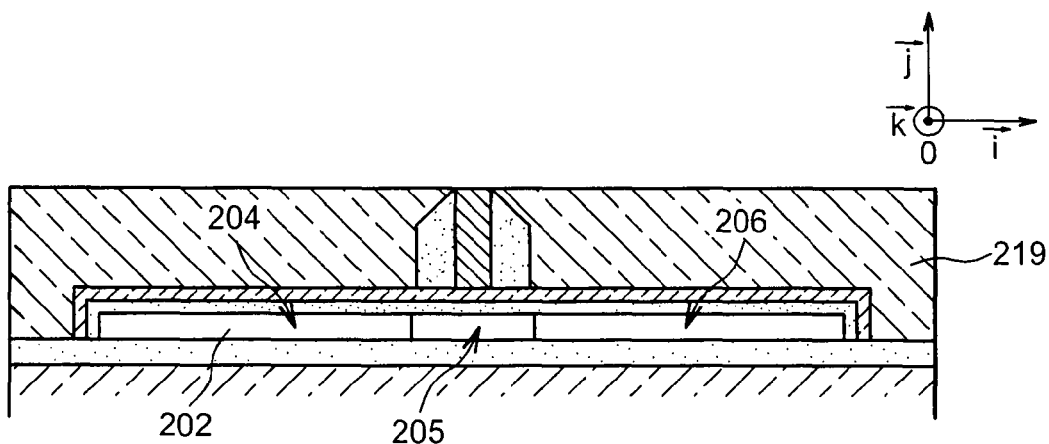
Figure 7D:
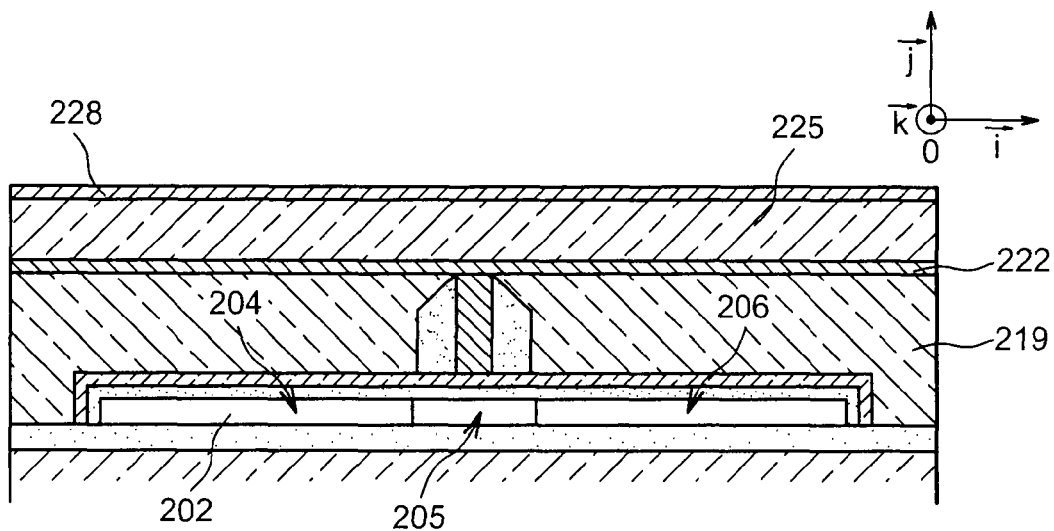

The second sacrificial layer 219 can be based on the same material as the first sacrificial layer 213 (FIG. 7C).

Then, a stack of layers is deposited, from which the piezoelectric actuation means are intended to be defined.

This stack can be formed by a layer 225 based on a piezoelectric material, such as, for example, AlN, PZT, $LiNbO_3$ or $LiTaO_3$, PMN-PT, $LiNbO_3$, $LiTaO_3$ situated between two conductive layers 222, 228 intended to act as biasing electrodes of the piezoelectric layer 225.

The conductive layers 222, 228 can be formed by a metal material, chosen according to the material used for the piezoelectric layer 225, and which can be, for example, Mo, Ti or Pt. The piezoelectric layer 225 can be produced by depositing a piezoelectric material or by adding this material to the conductive layer 222, using a bonding mechanism. An addition advantageously makes it possible to form a monocrystalline piezoelectric material.

The choice of the material of the conductive layers 222, 228 and the material of the piezoelectric layer 225 is designed to optimize the properties of piezoelectricity, and in particular the capacity of the layer 225 to be deformed under the action of an electric voltage imposed by the electrodes, preferably low or as low as possible.

In one case, for example, in which the piezoelectric material of the layer 225 is AlN, the conductive layers 222 and 228 can be based on Mo.

The piezoelectric material layer can have a thickness of between, for example, 100 nanometers and 1 micrometer, for example on the order of 150 nanometers. The conductive layers 222, 228 can have a thickness of between 10 nanometers and 100 nanometers, for example on the order of 10 nanometers.

Then, at least one pattern is produced, for example by photolithography and etching of the stack of layers 222, 225, 228 and the second sacrificial layer 219, so as to define a block in which a lower electrode 222a, a piezoelectric material block 225a on the lower electrode, and an upper electrode 228a on the piezoelectric material block 225 are produced. The block formed can have a rectangular pattern with a width W and a length L (the length L is defined in FIG. 7D in a direction parallel to the vector $\vec{i}$ of the orthogonal reference point $[0; \vec{i}; \vec{j}; \vec{k}])$.

Then, at least one insulating layer 231 is formed on the structure, for example, based on $SiO_2$ or $Si_3N_4$, or a stack of insulating layers, for example formed by a fine layer based on $Si_3N_4$, covered by a layer based on $SiO_2$.

A portion of this insulating layer 231 or this stack is then removed for example by etching in a zone located above the upper electrode 228a.

The remaining portions of the insulating layer 231 surround the transistor as well as the stack including the piezoelectric block 225a and the electrodes 222a, 228a. The remaining portions of the insulating layer 231 thus form a support or a reinforcing element, capable of supporting the stack of layers 222a, 225a, 228a of the piezoelectric actuator. The material of the insulating layer 231 can be chosen so as to have a rigidity greater than that of the piezoelectric material 225, so as to promote the movement of the gate induced by the deformation of the piezoelectric layer.

Then openings 233 and 235 are defined (FIGS. 7E and 8A) on each side of the gate of the transistor, for example by photolithography and through the stack of layers 228a, 225a, 222a, sacrificial layers 219, 213 and the gate dielectric zone 211, which openings expose, respectively, the source zone 204 and the drain zone 206 defined in the semiconductor zone 202. At least one opening 237 is also formed through the layers 228a, 225a, 222a so as to expose the gate 216 or the first conductive layer 222.

The openings 233, 235 and 237 can be formed with a diameter or a critical dimension d1 (defined in FIG. 7F in a direction parallel to the plane $[0; \vec{i}; \vec{k}])$.

Figure 7E:
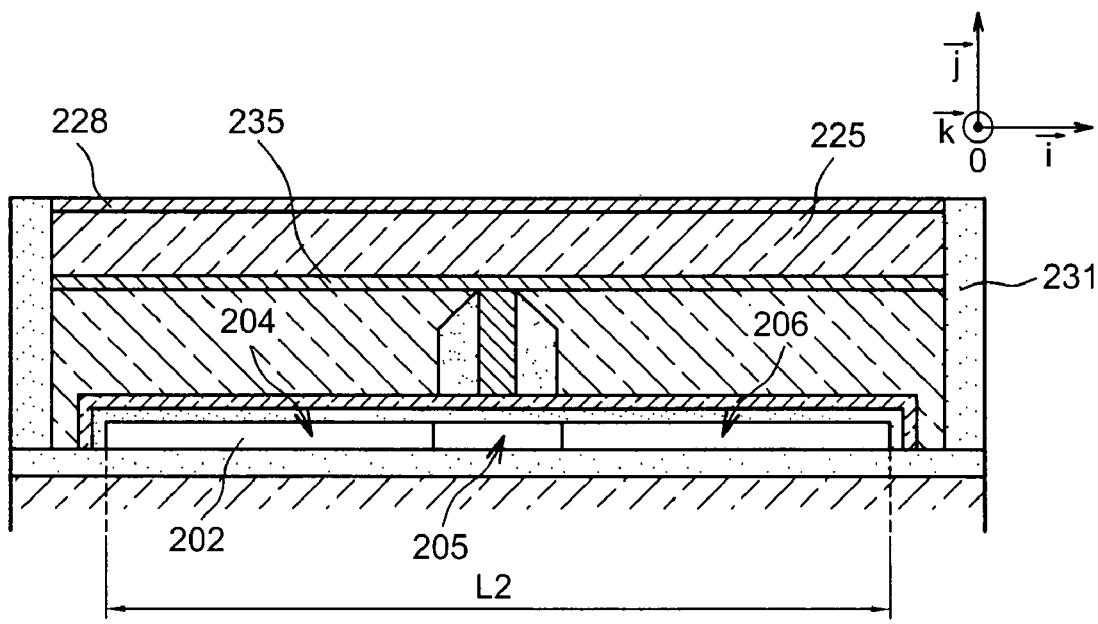
Figure 7F:
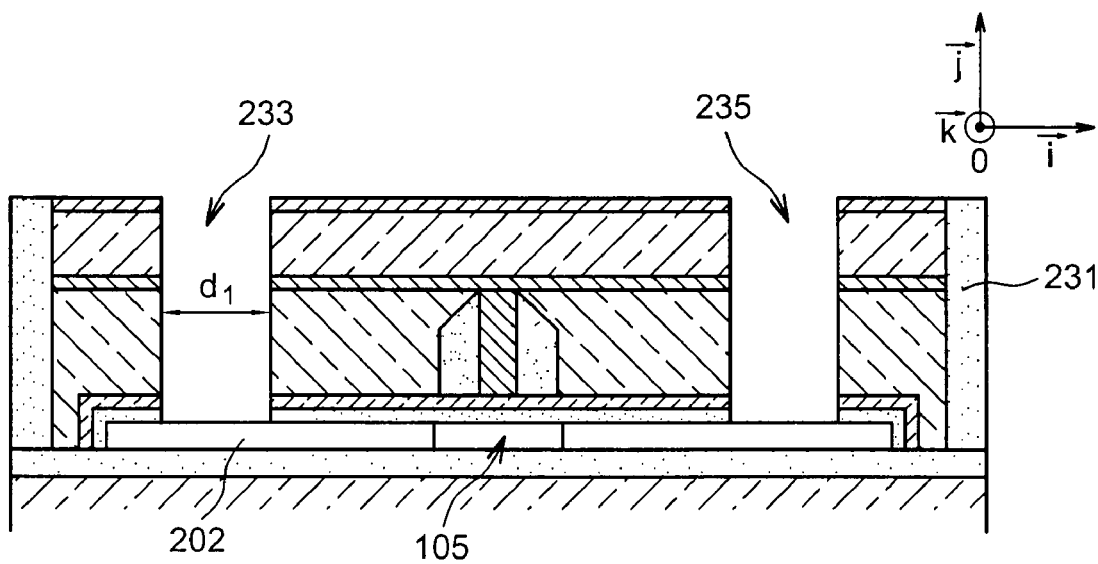
Figure 7G:
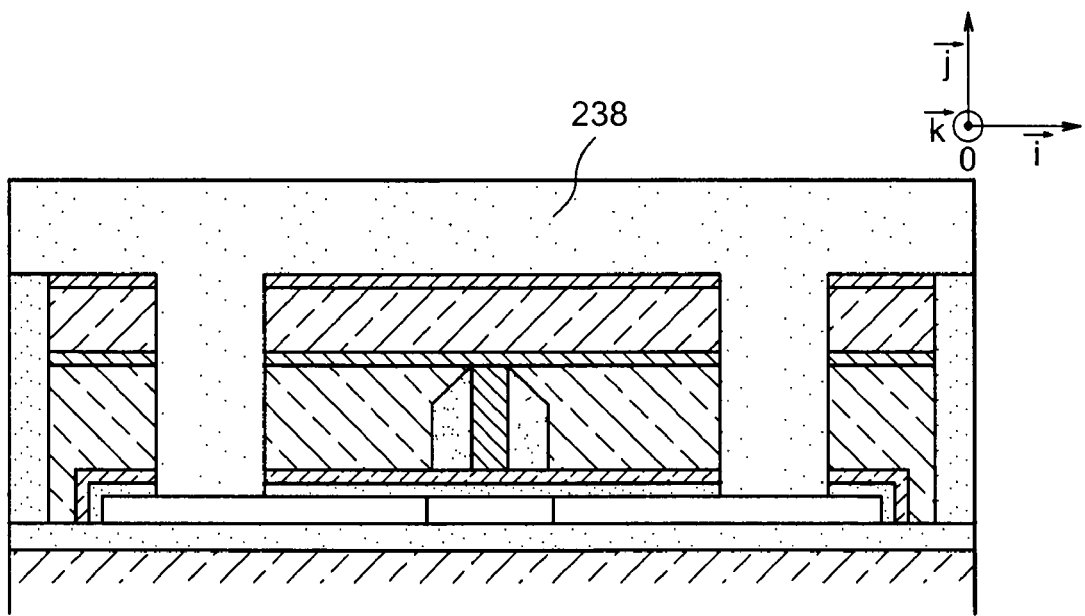
Figure 7H:
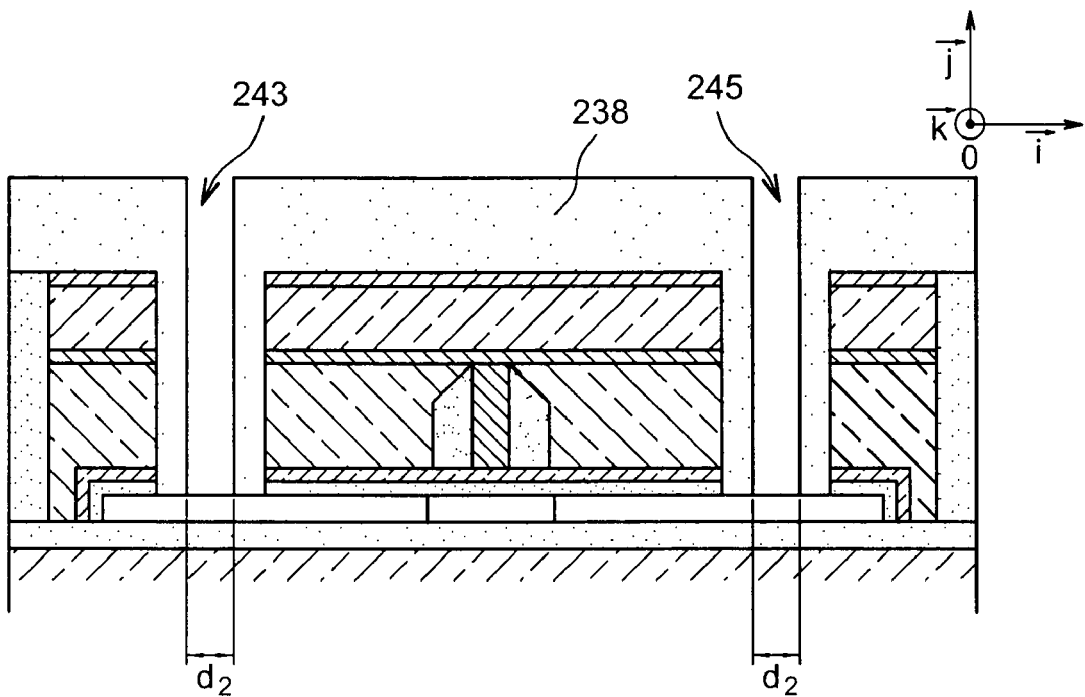

Then, the openings 233, 235 and 237 are filled with an insulating material 238, for example $SiO_2$ (FIG. 7G). It is then possible to carry out a chemical-mechanical polishing of the insulating material layer 238.

In the openings 233, 235 and 237 filled with insulating material 238, holes 243, 245 and 247 are respectively produced with a diameter or critical dimension d2 (defined in FIG. 7H in a direction parallel to the plane $[0; \vec{i}; \vec{k}])$ smaller than that d1 of the openings 233, 235 and 237. The holes 243, 245 and 247 respectively expose the source zone 204, the drain zone 206 and the gate 216 or the first conductive layer 222 (FIG. 7G).

A hole 249 exposing the upper electrode 228a is also produced.

Figure 7I:
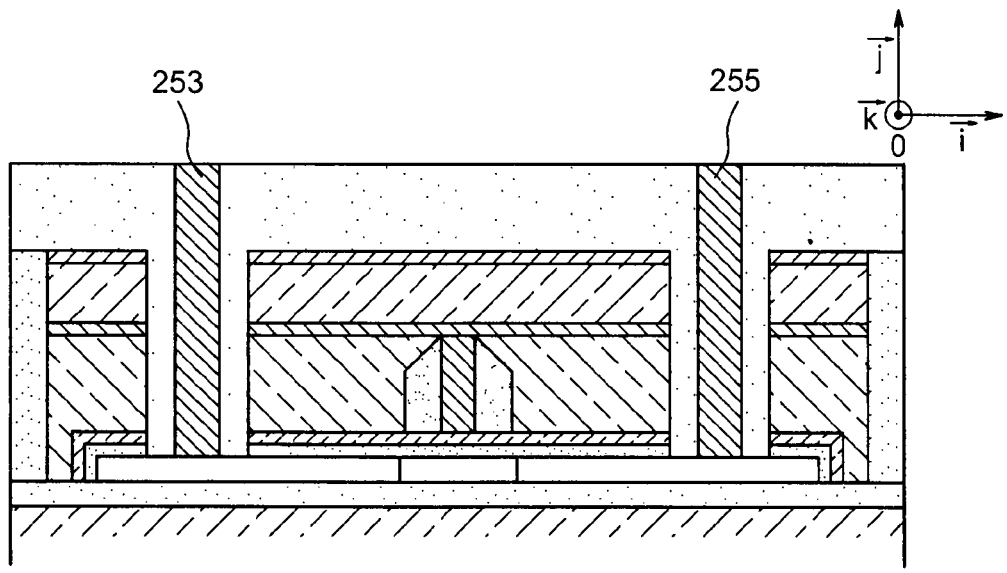
Figure 8A:
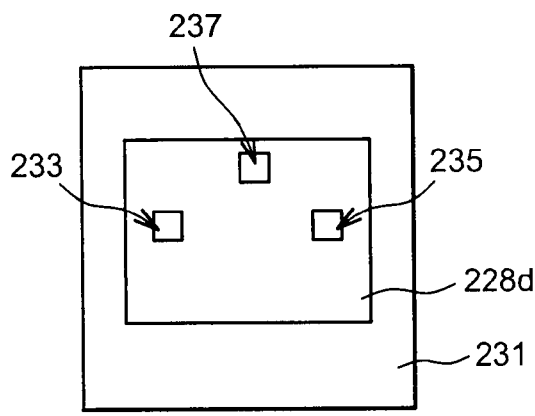
FIGS. 8A to 8E show, in a top view, steps of this example method.
Figure 8B:
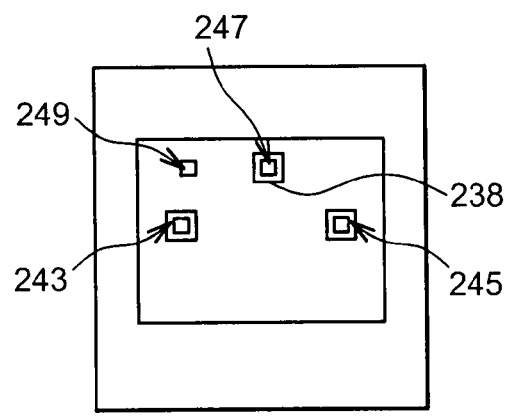
Figure 8C:
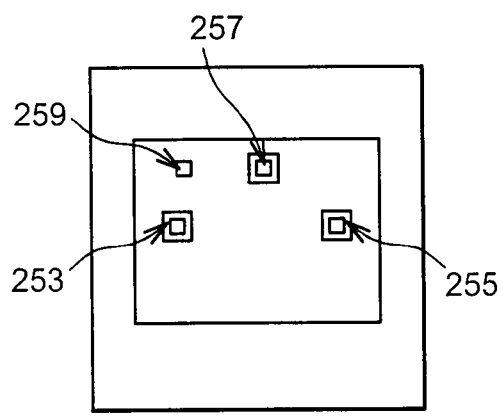

The holes 243, 245 and 247, 249 are then filled with at least one conductive material, for example a metal such as tungsten, so as to form conductive pads 253, 255 and 257, 259 in the holes 243, 245 and 247, 249. The conductive pads 253, 255, 257 and 259 are in contact, respectively, with the source zone 204, the drain zone 206, with the gate 216 or with the lower electrode 222a, and with the upper electrode 228a (FIGS. 7I and 8C).

Figure 8D:
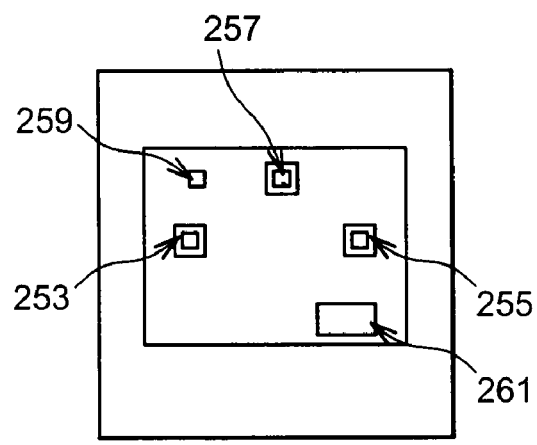

Then, at least one opening 261 is formed in the block, passing through the stack 220 and the sacrificial layers 213 and 219. The opening 261 can be produced, for example, by photolithography and etching steps (FIG. 8D).

A partial or total removal (FIG. 7J) of the sacrificial layers 213, 219 is then performed so as to separate the gate 216 from the gate dielectric 211. The removal of the sacrificial layers 213, 219 can be performed, for example, by delocalized plasma etching, in which the plasma is formed in a given chamber, then delocalized to another chamber in which the device comprising the sacrificial layers to be removed is placed.

The removal of the first sacrificial layer 213 is performed so as to produce a space 270 between the gate 216 and the gate dielectric layer 211. The removal can be performed by selective etching of the first layer with respect to the gate, from the gate dielectric. The removal can, for example, be performed by selective etching of a first semiconductor sacrificial layer, for example made of Si, with respect to a Ti gate, from a gate dielectric based on $SiO_2$. The etching can also be performed selectively with respect to spacers and/or support elements for example when they are based on $Si_3N_4$.

The second sacrificial layer 219 can also be removed so as to form a space around, or entirely around the gate 216. The removal can be performed by selective etching of the second layer with respect to the gate, from the gate dielectric and the support elements.

The removal can be performed, for example, by selective etching of a first sacrificial layer made of SiGe, with respect to a Ti gate, from a gate dielectric based on $SiO_2$ and spacers and/or support elements based on $Si_3N_4$.

Figure 7J:
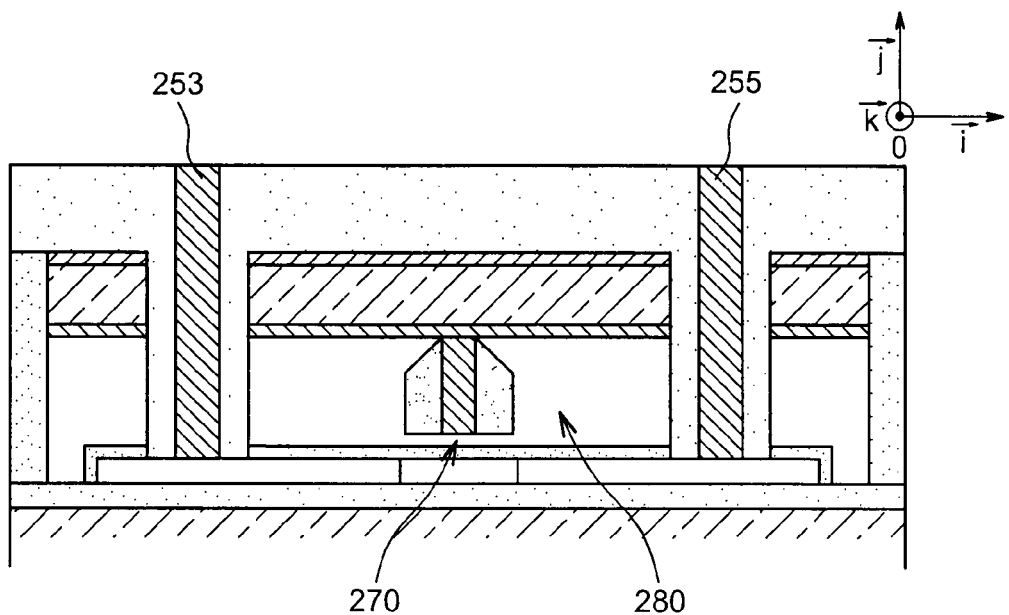

If the two sacrificial layers 213 and 219 are based on the same material, the removal of the two sacrificial layers 213 and 219 can be performed at the same time. A removal, optionally entire, of the second sacrificial layer 219 can be performed so as to produce a cavity 280 around the gate 216. After this step of removing the sacrificial layers 213, 219, the gate 216 is held or connected by its upper face, to the lower electrode 222a of the actuator (FIG. 7J).

In the example embodiment provided above, the upper electrode 228a resting on the piezoelectric layer 225 is not connected or electrically linked to any of the pads 253, 255, 257, source contact, drain contact or gate contact 257.

If necessary, the upper electrode 228a can subsequently be connected or electrically linked to the source pad 253, or to the drain pad 255, in subsequent steps of a part of the process commonly called "back-end steps" in which a plurality of metal interconnection layers are produced between components of the integrated circuits.

According to a possibility, the support layer 231 can be etched again so as to release the sides of the stack formed by electrodes 222a, 228a and the piezoelectric block 225a. If a rectangular pattern has been formed in the stack of layers 222a, 225a, 228a, the etching can be performed so as to release two sides, for example the two longest sides of the rectangle, so as to enable the piezoelectric layer 225a to be deformed more easily, under a biasing action.

Figure 8E:
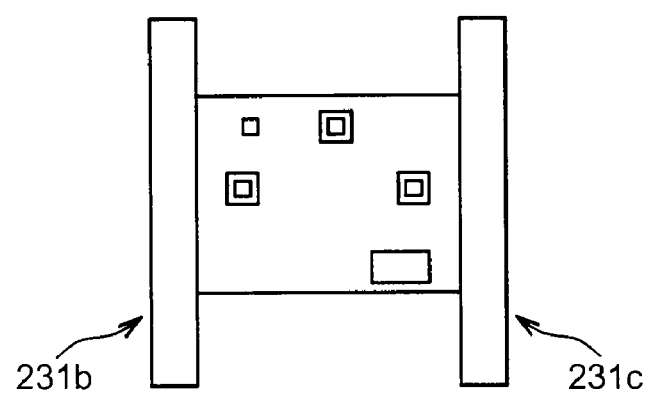

In FIG. 8E, the stack formed by the electrodes 222a, 228a and the piezoelectric block 225a is held suspended above the substrate 200 by means of two insulating elements or insulating support blocks 231b, 231c, formed by etching the insulating layer 231.

Figure 9A:
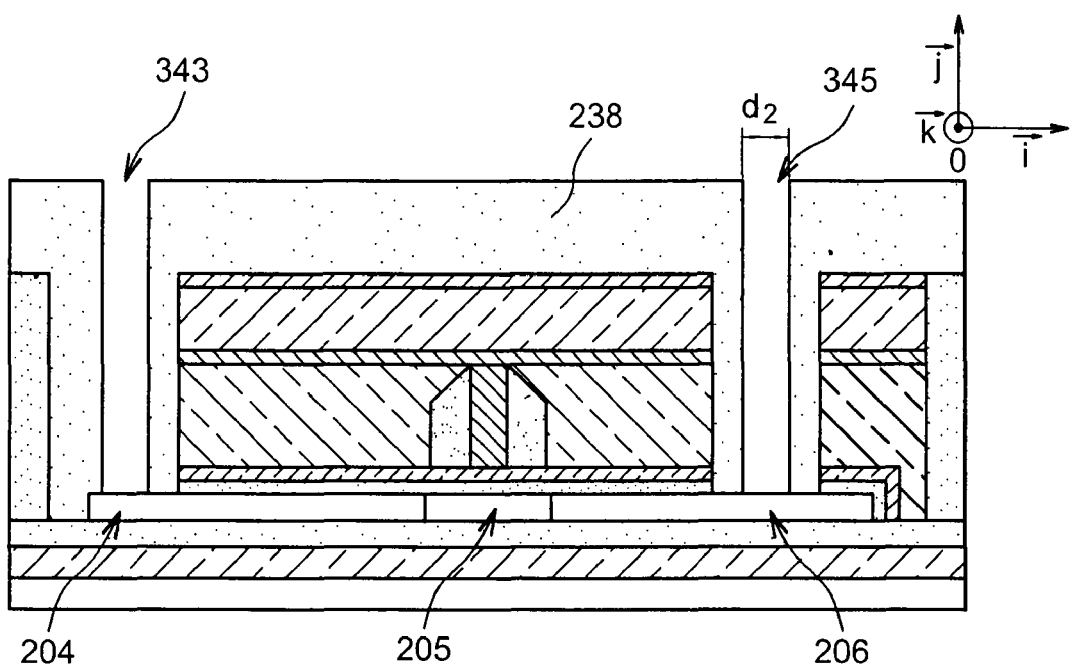
Figure 9B:
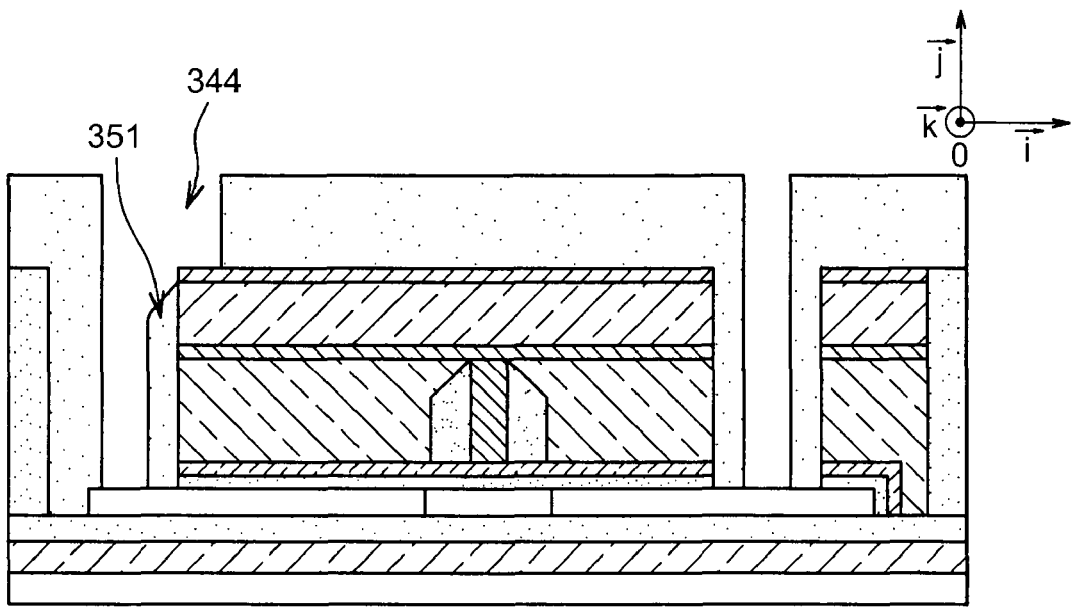
Figure 9C:
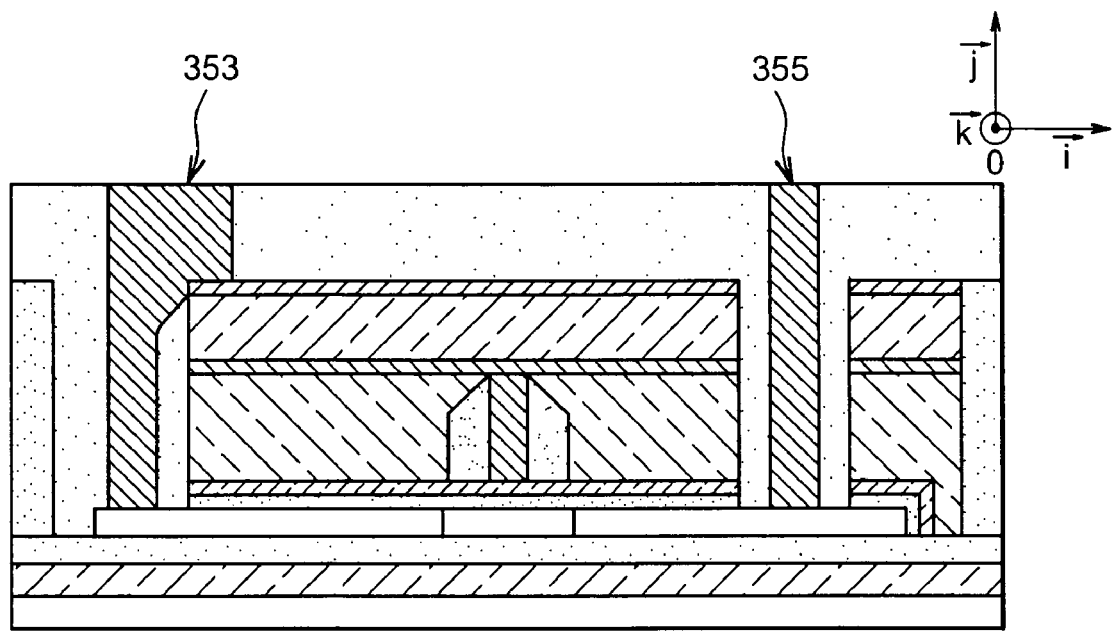
Figure 9D:
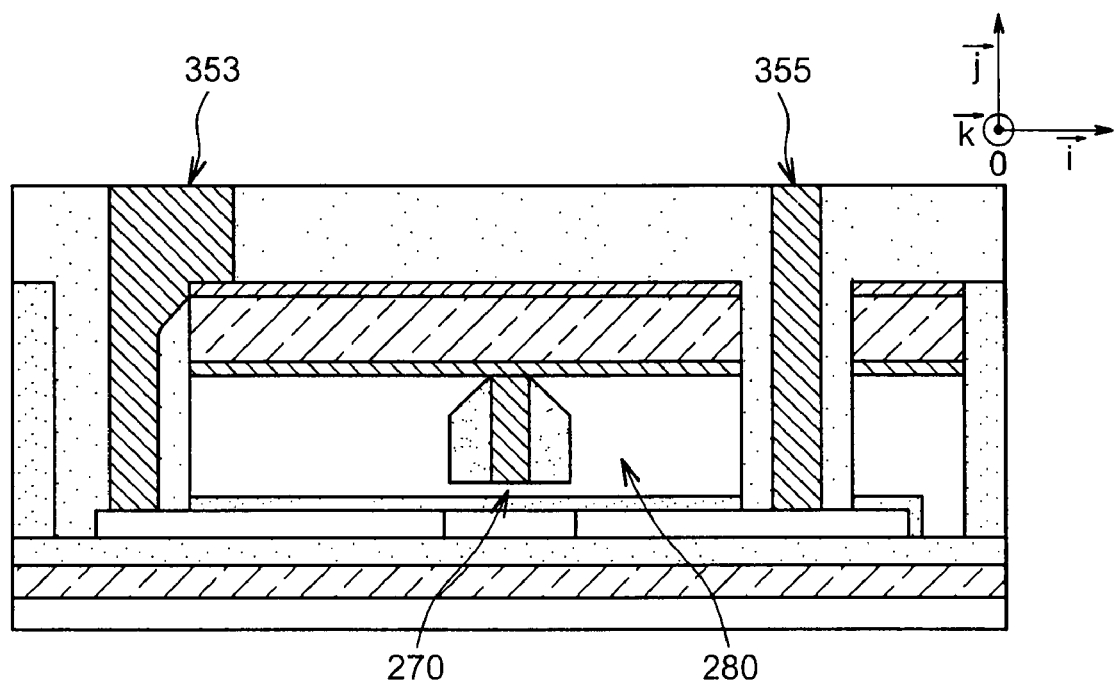
Figure 10A:
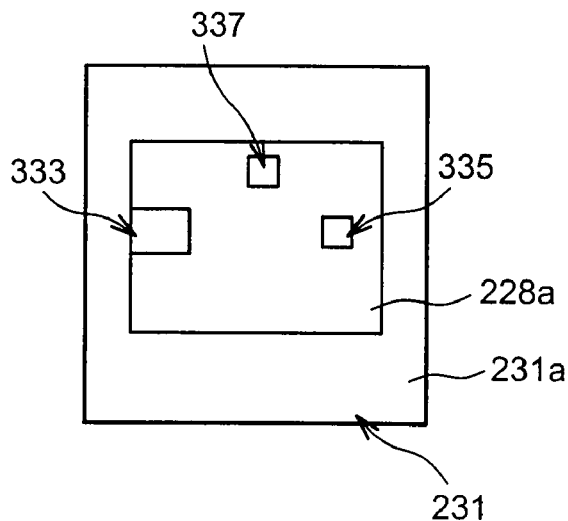
FIGS. 10A to 10C show, in a top view, steps of this alternative.
Figure 10B:
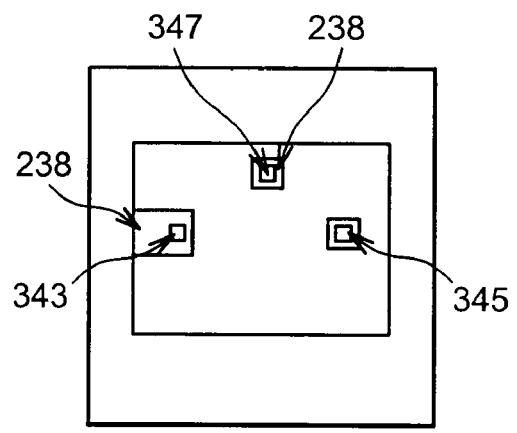
Figure 10C:
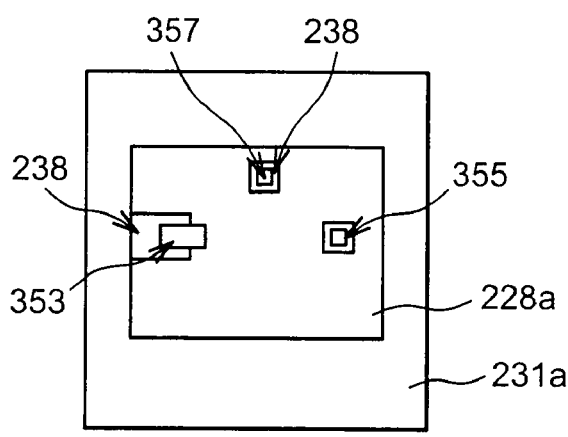

An alternative of the process example described above, and in particular of the fabrication of contact pads, will now be provided in reference to FIGS. 9A-9D, and 10A-10C (the device being produced is shown according to a transverse cross-section view in FIGS. 9A-9D and according to a top view in FIGS. 10A-10C).

For this alternative, the same steps are carried out as in the process example described above up to the fabrication of the support layer 231 based on an insulating material (up to FIG. 7E).

Then, openings 333 and 335 are defined on each side of the gate of the transistor, for example by steps of photolithography and etching through the stack of layers 228a, 225a, 222a, sacrificial layers 219, 213 and the gate dielectric zone 211, which openings expose, respectively, the source zone 204 and the drain zone 206 defined in the semiconductor zone 202 and the gate 216. At least one opening 337, exposing the gate zone 216 or the first conductive layer 222a, is also formed. The opening 333 exposing the source zone 204 can be formed with a diameter or a critical dimension greater than that of the other openings 335, 337 (FIG. 10A).

Then, the openings 333, 335 and 337 are filled with an insulating material 238, for example $SiO_2$.

In the openings 333, 335 and 337 filled with insulating material 238, holes 343, 345 and 347 are respectively produced with a diameter or critical dimension d2 smaller than that d1 of the openings 333, 335 and 337 (FIGS. 9A and 10B).

The opening 344 of a hole formed opposite an active zone, for example the opening 344 of the hole 343 exposing the source zone 204, is then enlarged. The opening of the hole 343 is enlarged so as to expose a portion of the upper face of the upper electrode 228a of the piezoelectric actuator. This enlargement is performed so as to preserve an insulating zone 351 or an insulating spacer 351 between the hole 343 and the lower electrode 222a of the actuator.

The holes 343, 345 and 347 are then filled with at least one conductive material, for example a metal such as tungsten, so as to form metal pads 353, 355 and 357 in the holes 343, 345 and 347. The metal pads 355 and 357 are in contact, respectively, with the drain zone and with the gate 216. The pad 353 formed from the hole 343 with the enlarged opening filled with metal is in contact with the upper electrode 228a and the source zone 204 (FIGS. 9C and 10C).

Then, at least one opening exposing the sacrificial layers 213 and 219 is formed. The opening can be produced so as to pass through the sacrificial layers 213, 219 or, according to an alternative, be produced at the periphery of the structure, but so as to expose the sacrificial layers 213, 219.

Then, through the opening, an etching of the sacrificial layers 213, 219 is performed so as to remove these sacrificial layers 213, 219 and in particular separate the gate 216 from the gate dielectric 211. A space 270 between the gate 216 and the gate dielectric layer 211 is thus formed. A cavity 280 all around the gate 216 can also be formed after removal of the second sacrificial layer 219, for example by selective isotropic etching (FIG. 9D).

According to the alternative mentioned above, a pad in contact with the source zone 204 and the second conductive layer 222 of the upper electrode 222a has been produced. It is possible, by carrying out a similar process, to form a pad in contact with the drain zone 206 and the second conductive layer 222 of the upper electrode 222a.

Figure 11A:
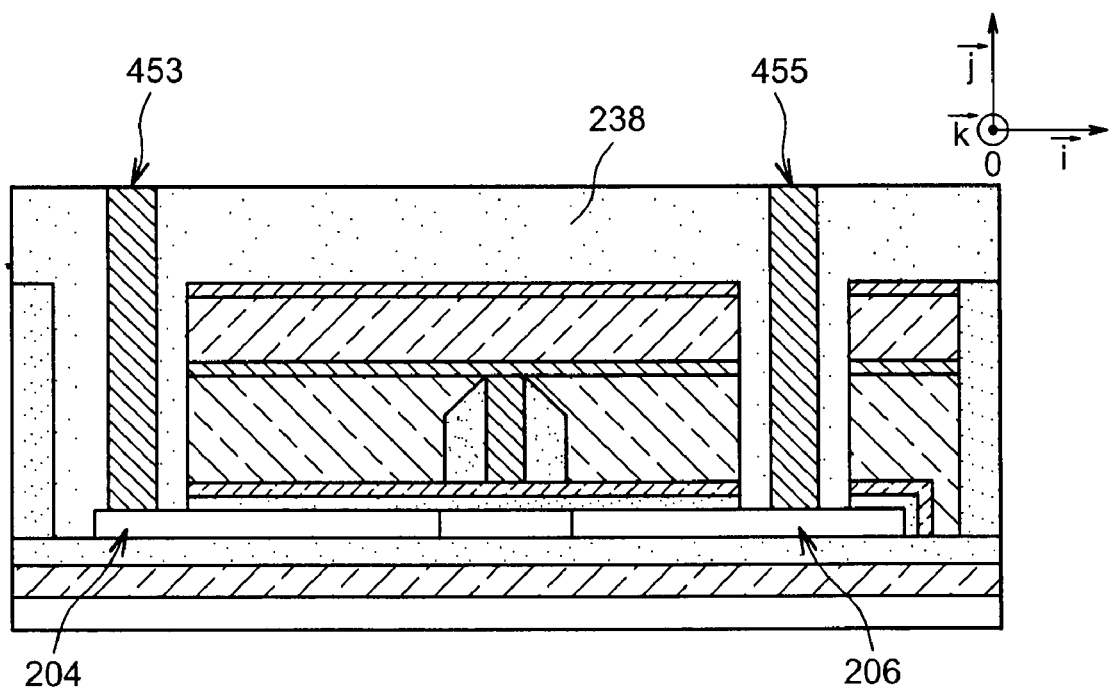
Figure 11B:
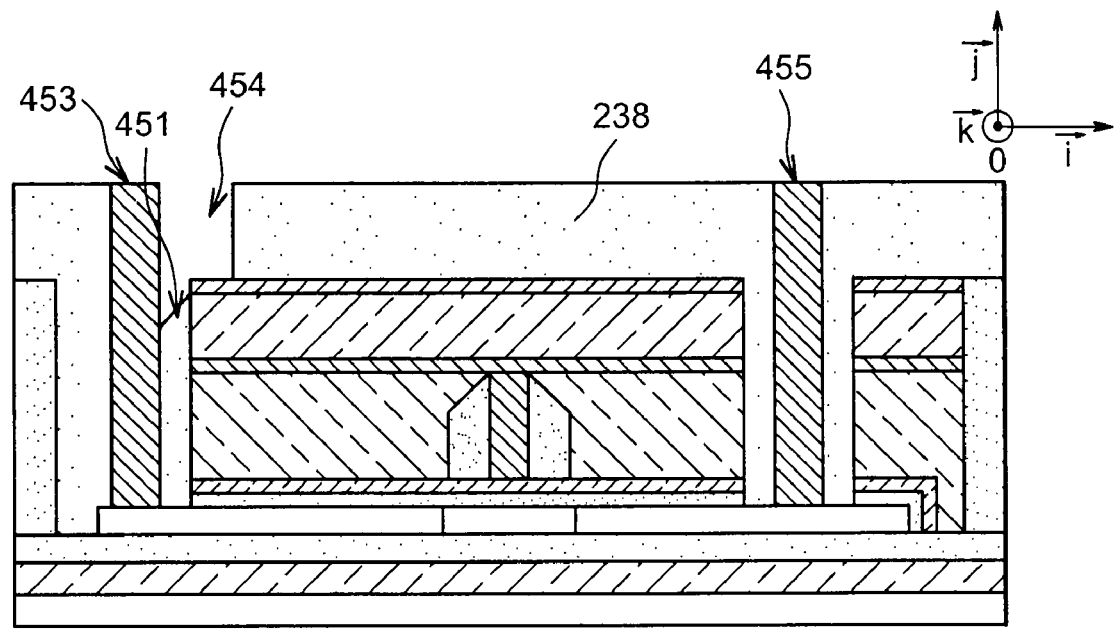

Another alternative embodiment of the contact pads will now be described in reference to FIGS. 11A-11C and 12A-12B (the device being produced is shown according to a transverse cross-section view in FIGS. 11A-11C and according to a top view in FIGS. 12A-12B).

For this alternative, the same steps as in the process example described above are carried out up to the fabrication of the holes 343, 345 and 347, with a diameter d2 smaller than that d1 of the openings 333, 335 and 337.

Then, the holes 343, 345 and 347 are filled with a metal, for example tungsten, so as to form conductive pads 453, 455 and 457 in the holes 343, 345 and 347. The conductive pads 453, 455 and 457 are in contact, respectively, with the source zone 204, the drain zone 206 and the gate 216 or the first electrode 222 (FIGS. 11A and 12A).

Near the pad 453 in contact with the source zone 204, an additional hole 444 is then produced in the insulating material 239, so as to expose a portion of the upper electrode 228a and the flanks of the pad 453. The additional hole 444 is produced so that an insulating zone 459 is preserved between the pad 453 and the lower electrode 222a (FIG. 11B).

Figure 11C:
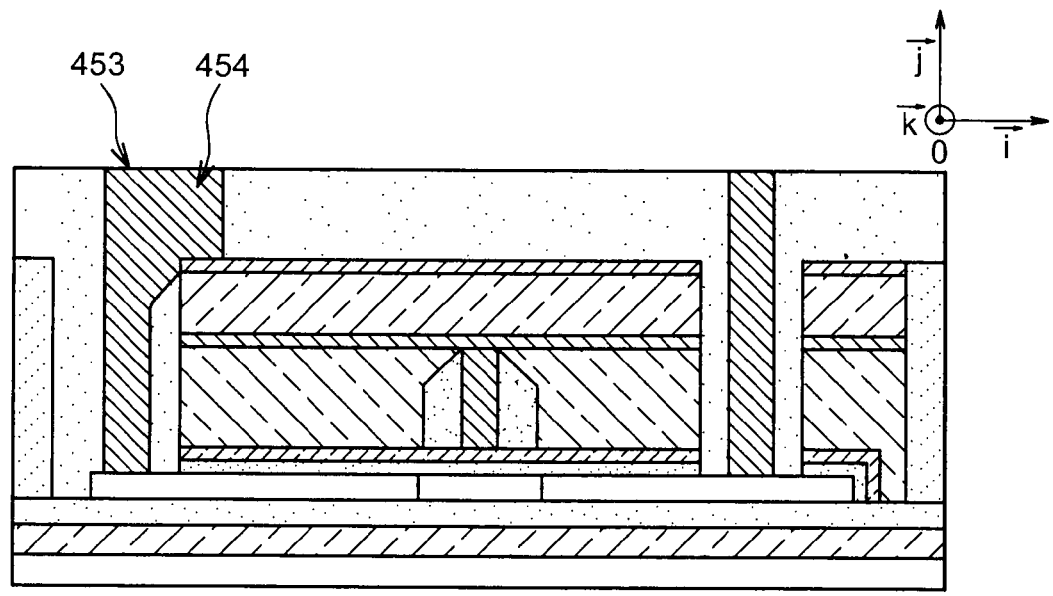
Figure 12A:
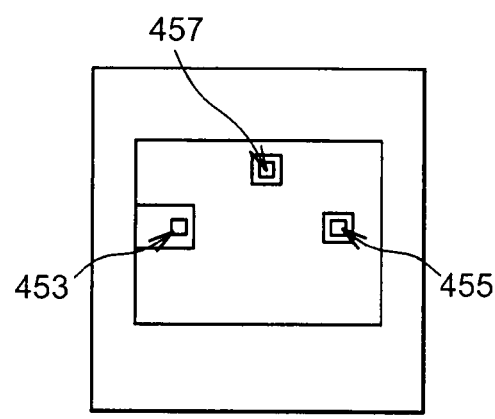
FIGS. 12A and 12B show, in a top view, steps of this other alternative.
Figure 12B:
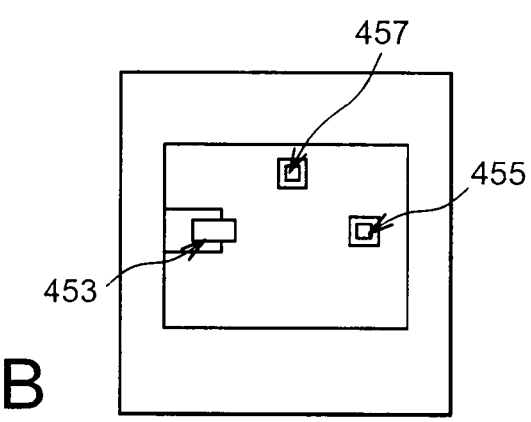

The hole 444 is then filled with a metal, for example such as tungsten, so as to form a metal zone 454 of extension of the pad 453, in contact with the upper electrode 228a of the piezoelectric actuator (FIGS. 11C and 12B).

The steps as described above for producing at least one opening in the structure are then carried out in order to access the sacrificial layers 213, 219.

Then, through said opening, the sacrificial layers 213, 219 are etched so as to remove these sacrificial layers 213, 219, and separate the gate 216 from the gate dielectric 211.

The second sacrificial layer 219 can also be removed so as to form a space around, or entirely around the gate 216. If the two sacrificial layers 213 and 219 are based on the same material, the removal of the two sacrificial layers 213 and 219 can be performed at the same time.

After this step of removing the sacrificial layers, the gate 216 is held or connected by its upper face, to the lower electrode 222a of the actuator.

According to the alternative described above, a pad in contact with the source zone 204 and the second conductive layer 222 of the upper electrode 222a has been produced. It is possible, by carrying out a similar process, to form a pad in contact with the drain zone 206 and the second conductive layer 222 of the upper electrode 222a.

CITED DOCUMENTS

[1]: A. M. Ionescu, V. Pott, R. Fritschi, K. Banerjee, M. J. Declercq, Ph. Renaud, C. Hibert, Ph. Fluckiger and G.-A. Racine: "Modeling and Design of Low Voltage SOI Suspended-Gate MOSFET (SG-MOSFET) with a Metal-Over-Gate Architecture", IEEE International Conference Symposium on Quality Electronic Design (ISQED), San Jose, Calif., 2002, pages 18-21.

[2]: H. Kam, D. T. Lee, R. T. Howe, T-J. King, "A new nano-electro-mechanical field effect transistor (NEMFET) design for low-power electronics", IEDM Technical Digest, p. 463-466, 2005.

[3]: N. Abelé, K. Séguéni, K. Boucart, F. Casset, L. Buchaillot, P. Ancey, A. M. Ionescu: "Ultra-Low Voltage MEMS Resonator Based on RSG-MOSFET", MEMS, p. 882-885, 2006.

[4]: N. Abelé, A. Villaret, A. Gangadharaiah, C. Gabioud, P. Ancey, A. M. Ionescu: "1T MEMS memory based on suspended gate MOSFET", IEDM 2006.

The invention claimed is:

1. A microelectronic device, including at least one transistor comprising:
on a substrate, a semiconductor zone with a channel zone covered with a gate dielectric zone,
a mobile gate, suspended above the gate dielectric zone and separated from the gate dielectric zone by an empty space, the gate being located at an adjustable distance from said gate dielectric zone, and
a piezoelectric actuation device including a stack formed by at least one layer of piezoelectric material resting on a first biasing electrode, and a second biasing electrode resting on the piezoelectric material layer, wherein
the gate is attached to said first biasing electrode and is in contact with said first biasing electrode, and said piezoelectric actuation device is configured to move the gate with respect to said channel zone.

2. The microelectronic device according to claim 1, wherein the gate is located in a cavity formed between said stack and said substrate.

3. The microelectronic device according to claim 1, further comprising at least one insulating support element, around said stack, said insulating support element being configured to hold said stack above the substrate.

4. The microelectronic device according to claim 1, comprising a plurality of insulating elements for supporting said stack, including at least one support element against a flank of said stack and at least one other support element against another flank of said stack.

5. The microelectronic device according to claim 4, wherein said stack includes one or more free lateral faces or flanks.

6. The microelectronic device according to claim 1, further comprising:
a plurality of conductive pads that include,
at least one first conductive pad connected to a source region of said transistor,
at least one second conductive pad connected to a drain region of said transistor, and
at least one third conductive pad connected to the gate of said transistor, which third pad is in contact with the first biasing electrode or the gate.

7. The microelectronic device according to claim 6, further comprising: at least one fourth conductive pad connected to the second biasing electrode.

8. The microelectronic device according to claim 6, wherein said first pad or said second pad is connected to the second biasing electrode.

9. The microelectronic device according to claim 1, wherein the transistor has a variable threshold voltage that varies by moving the mobile gate with the piezoelectric actuation device.

10. The microelectronic device according to claim 1, wherein the microelectronic device has at least one first position in which the gate is located at a first distance from the channel zone, and at least one second position in which the gate is located at a second distance from the channel zone, different from the first distance.

11. The microelectronic device according to claim 10, wherein in the first position, the piezoelectric layer is in a resting position in which the piezoelectric layer is planar, or substantially planar, and the gate is at a predetermined non-zero resting distance from the channel zone.

12. The microelectronic device according to claim 10, wherein in the second position, the piezoelectric layer is bent, and the gate is in contact with the gate dielectric zone.

13. The microelectronic device according to claim 10, further comprising:
a power supply that powers the transistor and the actuation device, wherein the microelectronic device is configured to adopt a given position among said first and second positions, and is also configured to hold the gate in said given position after said power supply device have been stopped or cut off.

14. The microelectronic device according to claim 10, wherein the microelectronic device is configured to adopt a state in which the piezoelectric actuation device is set in a given biasing state, and in which the gate is held by the piezoelectric actuation device in contact with the gate dielectric zone, and to also adopt another state in which the piezoelectric actuation device is not biased, and in which the gate is held, by forces of adhesion or molecular bonding, in contact with the gate dielectric zone.

15. The microelectronic device according to claim 10, wherein the microelectronic device is configured to adopt a state in which the piezoelectric actuation device is set in a given biasing state making it possible to separate the gate from the gate dielectric.

16. A microelectronic device, including at least one transistor comprising:
   on a substrate, a semiconductor zone with a channel zone covered with a gate dielectric zone,
   a mobile gate, suspended above the gate dielectric zone and separated from the gate dielectric zone by an empty space, the gate being located at an adjustable distance from said gate dielectric zone,
   a piezoelectric actuation device including a stack formed by at least one layer of piezoelectric material resting on a first biasing electrode, and a second biasing electrode resting on the piezoelectric material layer, the gate being attached to said first biasing electrode, and said piezoelectric actuation device is configured to move the gate with respect to said channel zone, and
   a power supply device that powers the transistor and said actuation device, wherein
   said microelectronic device has at least one first position in which the gate is located at a first distance from the channel zone, and at least one second position in which the piezoelectric layer is bent, and the gate is in contact with the gate dielectric zone and held in said second position after said power supply device has been stopped or cut off, by forces of adhesion or molecular bonding.

17. The microelectronic device according to claim 16, wherein the gate is in contact with said first biasing electrode.

18. The microelectronic device according to claim 16, wherein the gate is located in a cavity formed between said stack and said substrate.

19. The microelectronic device according to claim 16, further comprising at least one insulating support element, around said stack, said insulating support element holding said stack above the substrate.

20. The microelectronic device according to claim 19, wherein said stack includes one or more free lateral faces or flanks.

21. The microelectronic device according to claim 16, further comprising a plurality of insulating elements that support said stack, including at least one support element against a flank of said stack and at least one other support element against another flank of said stack.

22. The microelectronic device according to claim 16, further comprising:
   a plurality of conductive pads including,
      at least one first conductive pad connected to a source region of said transistor,
      at least one second conductive pad connected to a drain region of said transistor, and
      at least one third conductive pad connected to the gate of said transistor, which third pad is in contact with the first biasing electrode or the gate.

23. The microelectronic device according to claim 22, further comprising at least one fourth conductive pad connected to the second biasing electrode.

24. The microelectronic device according to claim 16, wherein said first pad or said second pad is connected to the second biasing electrode.

* * * * *